United States Patent
Lofgreen et al.

(10) Patent No.: US 11,694,942 B2
(45) Date of Patent: Jul. 4, 2023

(54) ANNULAR SILICON-EMBEDDED THERMOELECTRIC COOLING DEVICES FOR LOCALIZED ON-DIE THERMAL MANAGEMENT

(71) Applicant: Intel Corporation, Santa Clara, CA (US)

(72) Inventors: Kelly Lofgreen, Phoenix, AZ (US); Chandra Mohan Jha, Chandler, AZ (US); Krishna Vasanth Valavala, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1033 days.

(21) Appl. No.: 16/168,534

(22) Filed: Oct. 23, 2018

(65) Prior Publication Data
US 2020/0126888 A1 Apr. 23, 2020

(51) Int. Cl.
*H01L 23/38* (2006.01)
*H10N 10/01* (2023.01)
*H10N 10/17* (2023.01)
*H10N 10/851* (2023.01)
*H10N 19/00* (2023.01)
(Continued)

(52) U.S. Cl.
CPC ............ *H01L 23/38* (2013.01); *H10N 10/01* (2023.02); *H10N 10/17* (2023.02); *H10N 10/851* (2023.02); *H10N 19/101* (2023.02); *H01L 23/481* (2013.01); *H01L 24/09* (2013.01); *H01L 25/165* (2013.01); *H01L 25/50* (2013.01); *H01L 2924/1432* (2013.01); *H01L 2924/1434* (2013.01)

(58) Field of Classification Search
CPC ....... H01L 23/38; H01L 35/32; H01L 35/325; H10N 10/01; H10N 10/851; H10N 19/101; H10N 10/17
See application file for complete search history.

(56) References Cited

U.S. PATENT DOCUMENTS 5,956,569 A * 9/1999 Shiu ................. H01L 23/38
136/203
9,444,027 B2 * 9/2016 Dibra .................. H10N 10/17
(Continued)

OTHER PUBLICATIONS

Angela D. McConnell; Thermal Conductivity of Doped Polysilicon Layers; Journal of Microelectromechanical Systems, vol. 10, No. 3, Sep. 2001 (Year: 2001).*

*Primary Examiner* — Aaron J Gray
(74) *Attorney, Agent, or Firm* — Essential Patents Group, LLP

(57) ABSTRACT

An integrated circuit (IC) package comprising an IC die, the IC die having a first surface and an opposing second surface. The IC die comprises a semiconductor material. The first surface comprises an active layer. A thermoelectric cooler (TEC) comprising a thermoelectric material is embedded within the IC die between the first surface and the second surface and adjacent to the active layer. The TEC has an annular shape that is substantially parallel to the first and second surfaces of the IC die. The thermoelectric material is confined between an outer sidewall along an outer perimeter of the TEC and an inner sidewall along an inner perimeter of the TEC. The outer and inner sidewalls are substantially orthogonal to the first and second surfaces of the IC die.

15 Claims, 9 Drawing Sheets

(51) Int. Cl.
    *H01L 23/00*           (2006.01)
    *H01L 25/00*           (2006.01)
    *H01L 23/48*           (2006.01)
    *H01L 25/16*           (2023.01)

(56) References Cited

U.S. PATENT DOCUMENTS

| | | | |
|---|---|---|---|
| 2002/0134419 A1* | 9/2002 | Macris | H01L 23/38 |
| | | | 62/3.2 |
| 2015/0255451 A1* | 9/2015 | Yasusaka | H01L 27/0248 |
| | | | 257/368 |
| 2016/0027986 A1* | 1/2016 | Kim | H01L 25/18 |
| | | | 136/200 |

\* cited by examiner

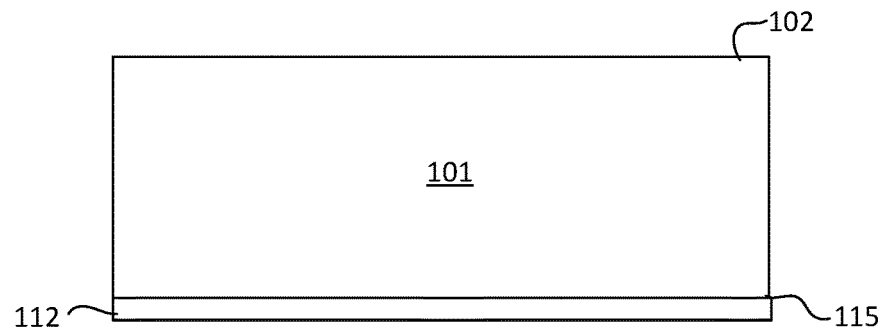
FIG. 8A
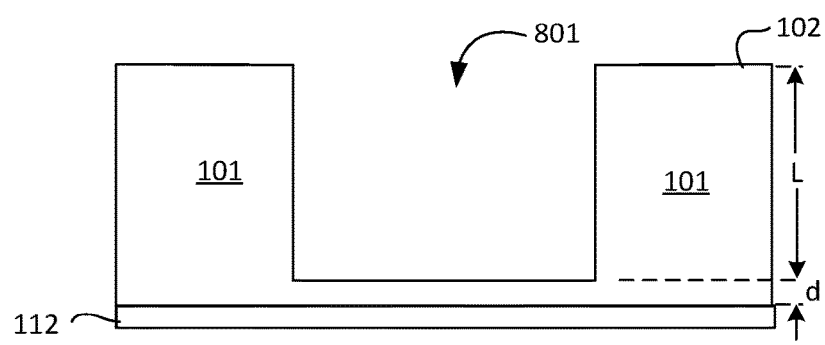
FIG. 8B
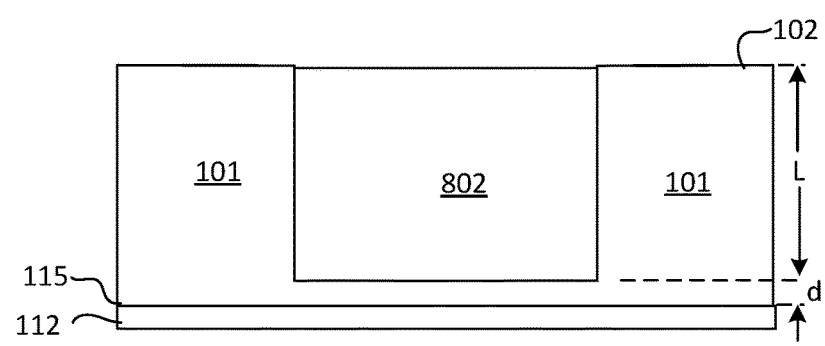
FIG. 8C
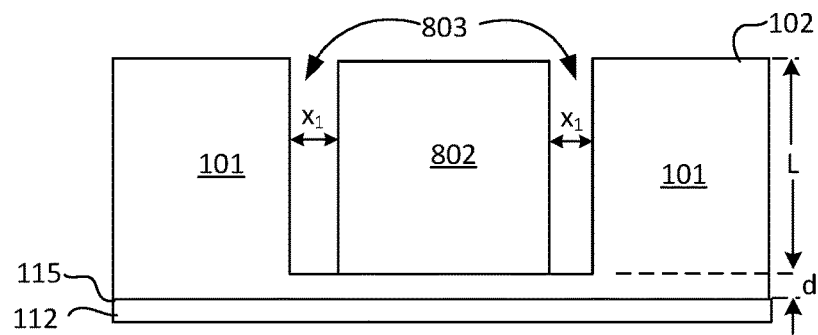
FIG. 8D
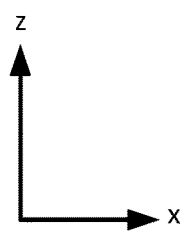

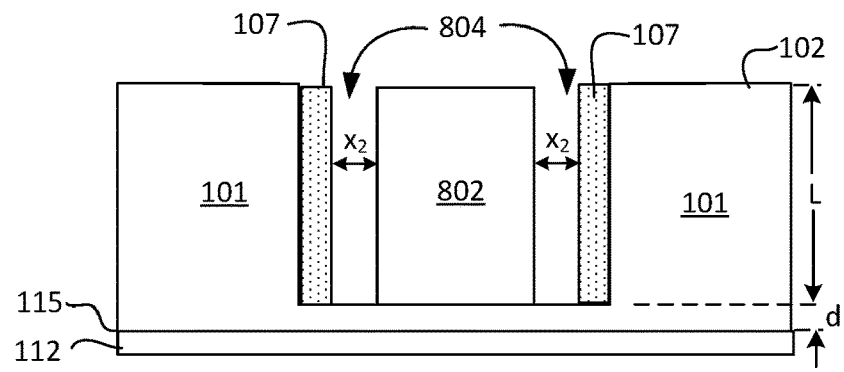
FIG. 8E
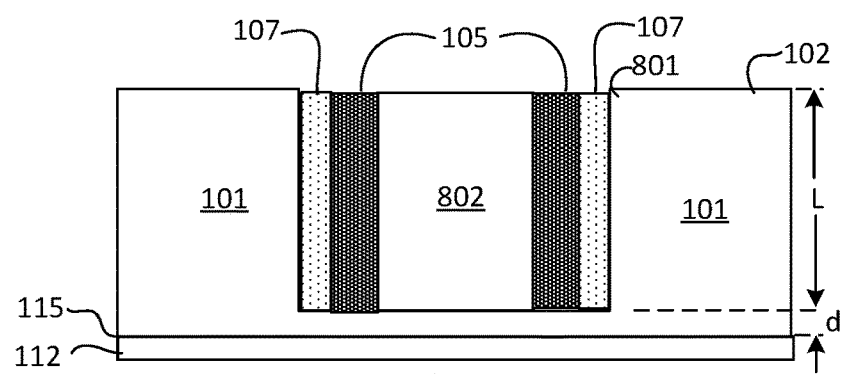
FIG. 8F
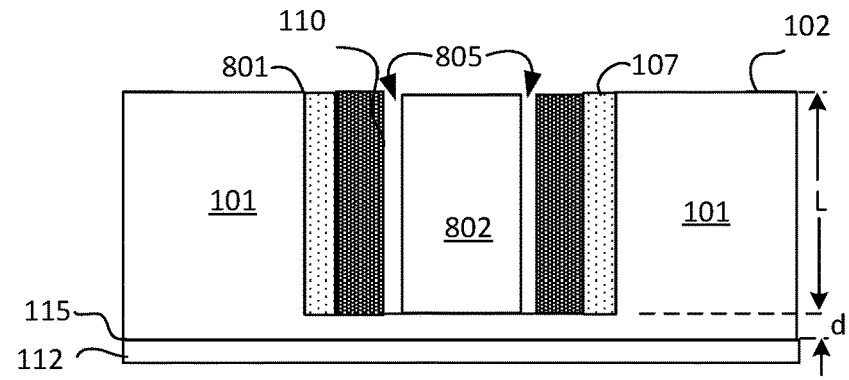
FIG. 8G
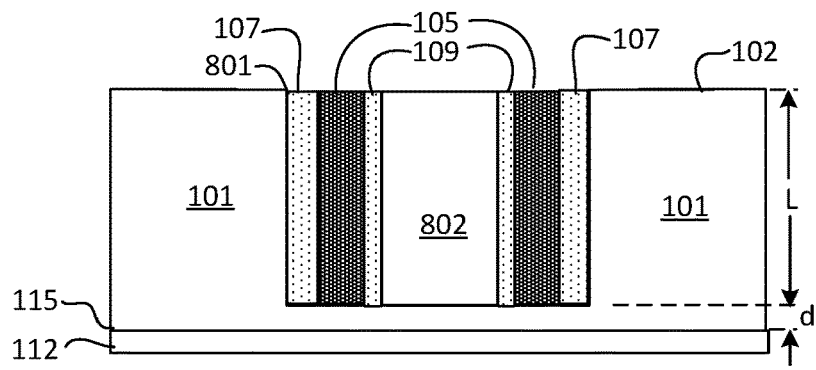
FIG. 8H
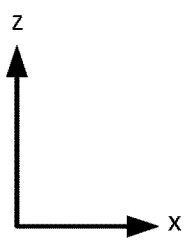

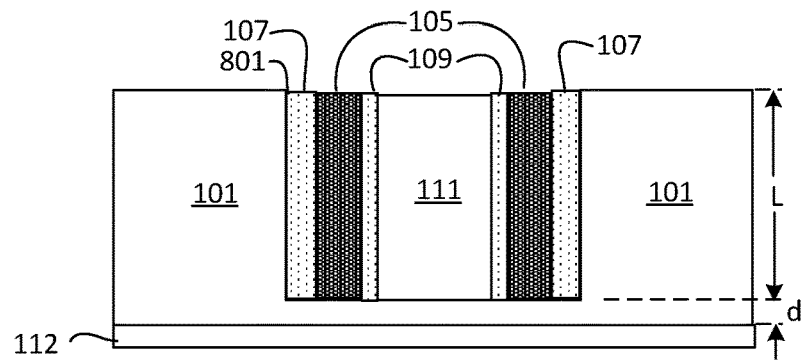
FIG. 8I
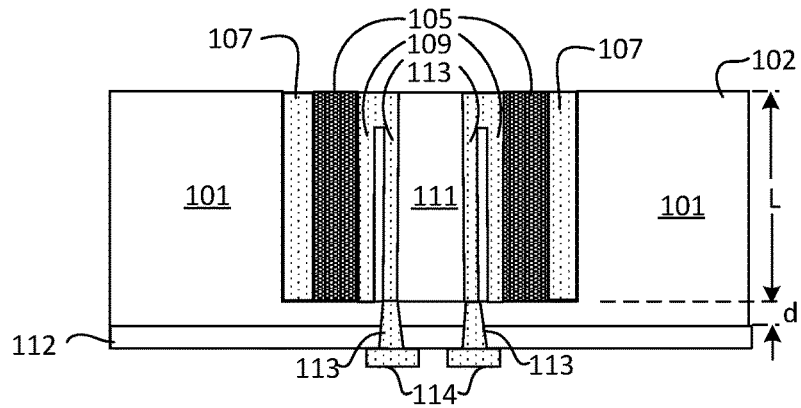
FIG. 8J
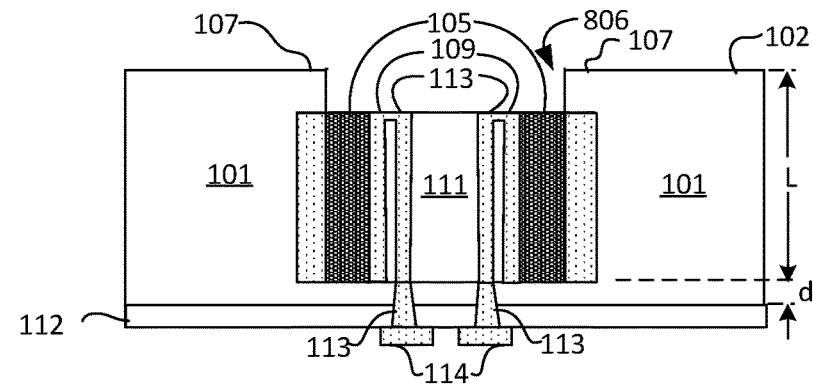
FIG. 8K
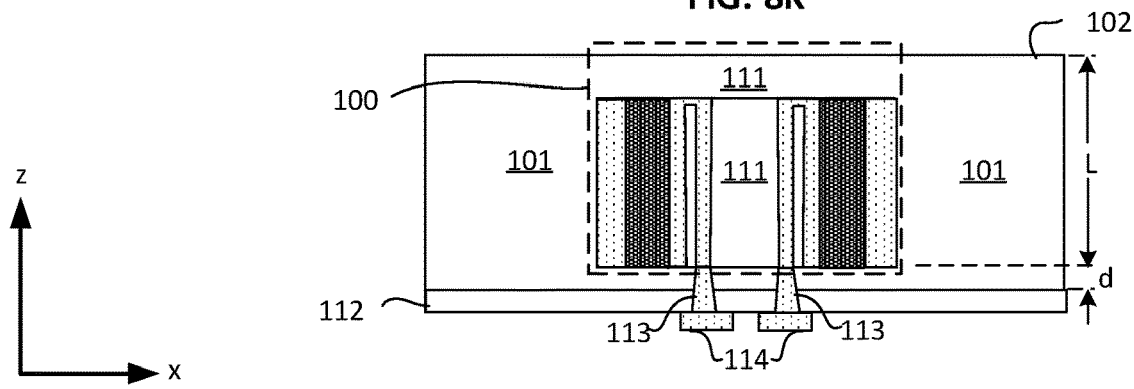
FIG. 8L
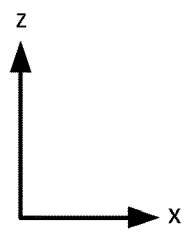

ANNULAR SILICON-EMBEDDED THERMOELECTRIC COOLING DEVICES FOR LOCALIZED ON-DIE THERMAL MANAGEMENT

BACKGROUND

Thermal management in microelectronics packaging is becoming an increasingly important issue. Package architectures for high-power devices such as server logic integrated circuits (ICs) demand smaller feature sizes and greater feature densities, where routing of traces and vias carrying large amounts of power is increasingly compact. Package architectures involving close routing of power-carrying traces and signal traces leave little space for heat dissipation. It is common that hotspots form within the active layer(s) of the die(s) during operation of the devices. On-die hotspots may generate heat fluxes exceeding $10/mm^2$. Solutions that have been tried for thermal management of hot spots include placement of a high thermal-conductivity material above the hotspot to conduct heat away from the area. Large external thermal solutions in the form of high-efficiency heat sinks and heat transfer contact materials are presently the mainstay thermal management paradigm. These conventional solutions may be quickly reaching the upper limits of their performance as power densities increase that surpass the heat transfer capabilities of conventional solutions.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 8A-8L illustrate an exemplary method for making an annular thermoelectric cooler embedded in a die, according to some embodiments of the disclosure.

DETAILED DESCRIPTION

Figure 1A:
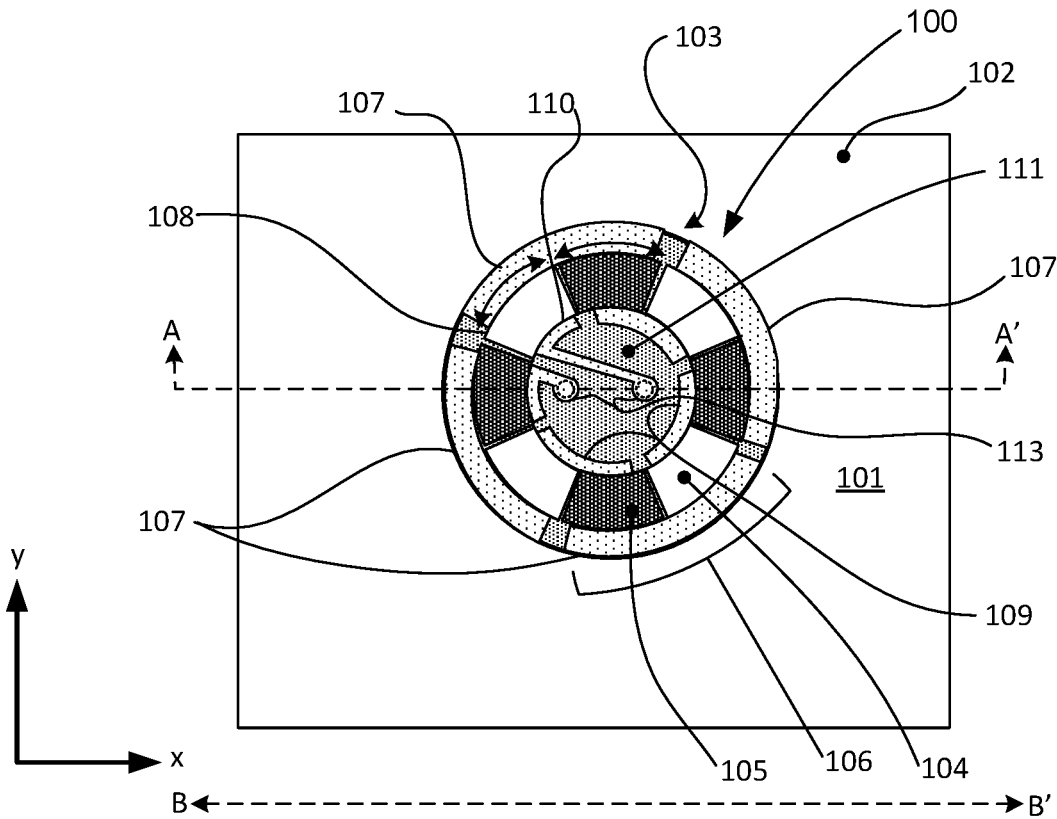
FIG. 1A illustrates a plan view of an annular thermoelectric cooler embedded in a die, according to embodiments of the disclosure.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

During operation of integrated circuit (IC) devices, processing demands may cause short- or long-term power spikes, potentially resulting in a current draw of multiple amperes. Due to the high density of trace routing in modern microprocessors and the like, hotspots commonly form within the active layers of the IC dies. Heat must be rapidly transferred away from the hotspot to protect the active layer in the vicinity of the hotspot. Specifically, integrated transistors and other active and passive electronic components within the active layer are prone to damage, or malfunction, if the temperature exceeds acceptable limits.

Large external thermal solutions in the form of high-efficiency heat sinks and thermal interface materials may benefit from more localized solutions to manage heat buildup in and near hotspots to protect circuitry and extend the life of an IC. Passive conduction of heat through the die substrate may be augmented by addition of embedded active thermal devices, such as integrated thermoelectric coolers (TECs) embedded within the die interior.

A planar TEC embedded within the semiconductor substrate below the level of the active layer in the vicinity of potential hotspots might offer active cooling of the hotspots, providing on-demand localized cooling. However, benefits of a planar TECs may be limited if a thermoelectric material has a lower thermal conductivity (k) than the surrounding semiconductor material, retarding passive heat transfer. As described further below, embodiments of an integrated TEC device have an annular form factor, where the definition of "annular" (see below) is expanded to mean any round or polygonal ring-like structure. In general, the ring-like structure surrounds an interior region (e.g., an interior region encompassed by the ring). The interior region generally comprises a material that is different from the material of the ring structure.

Herein, an annular TEC device comprises a strip of thermoelectric material following a round or polygonal path surrounding an interior region comprising a different material. In some embodiments, the material of the interior region has a higher thermal conductivity than the surrounding thermoelectric material. The annular form factor advantageously promotes heat transfer from a hotspot in the inactive state. The cooling performance and operational efficiency of the annular TEC device embodiments may therefore be advantageously high.

Embodiments of the disclosed annular TEC devices include thermoelectric strips in the form of closed annuli or comprising one or more segments of thermoelectric material that follow the contours of an annular path, having an outer sidewall and an inner sidewall on each side of the thermoelectric strip. In some embodiments, the disclosed annular TEC devices have a circular or generally curved annular form factor. In alternate embodiments, the form factor is rectilinear.

The disclosed annular TEC devices are embedded within the semiconductor material of an IC die. The inner sidewall of the TEC devices at least partially surrounds a region of semiconductor material confined within the interior region that is in close proximity to a potential hotspot in the active layer of the IC die. The semiconductor material may be the same as the die material.

The annular structure of the disclosed TEC devices may facilitate superior passive heat transfer through the device to the die backside even when the TEC is inactive. The backside of the die may be interfaced directly, or through top layers of a package, with a thermal solution comprising a heat sink. Heat reaching the die backside may then be removed from the die. When the disclosed TEC device is energized into the active state by application of an appropriate voltage to the electrodes of the TEC, a cold junction is created (e.g., at the inner sidewall of the disclosed annular TEC device), and a hot junction is created (e.g., at the outer sidewall). Where a center of the TEC is positioned relative to a potential hotspot (e.g., aligned with the hotspot), the cold junction may surround the hotspot, and absorb heat generated by the hotspot. Heat may then be transferred (e.g., laterally through the TEC) where it is rejected through the hot junction to surrounding semiconductor material in contact with the hot junction. Heat may then flow according to any thermal gradient that may be present between the hot junction and the die backside, or elsewhere.

As described herein, some embodiments of the annular TEC device include closed form (e.g., circular or rectangular) or segmented thermoelectric strips comprising alternating thermoelectric elements having opposite charge types (e.g., p-type and n-type). The thermoelectric elements of opposite charge type alternate along the thermoelectric strip(s). In the described embodiments, the thermoelectric strip(s) may follow(s) a perimeter path surrounding a region of native semiconductor material of the IC die substrate, or a region of alternative fill material (e.g., dielectric material deposited over the IC die substrate, or in the interior region of the annular TEC).

In this disclosure, the term "annular" generally refers to a ring-like or other closed form structure that is either curved or rectilinear. The annular structure as defined herein comprises an outer sidewall and an inner sidewall. An example is a circular or square annulus. Also implied in this definition is the presence of an interior region (i.e., interior) that is surrounded by the inner sidewall of the annulus. Specifically, the inner sidewall partially or completely surrounds a region of native semiconductor material, or alternative fill material that is other than a thermoelectric material. Advantageously, the material within the interior of the annular TEC device has a higher thermal conductivity than the thermoelectric material.

The annular TEC comprises alternating p-type and n-type elements arranged in an interleaved manner, where the elements may be physically separated from each other by a small gap, and therefore not in direct contact. Inner and outer electrodes electrically couple adjacent elements. However, metallic electrodes may form an electrical junction with the thermoelectric materials.

As an example, p-type elements are electrically coupled to neighboring n-type elements, forming adjacent thermoelectric couples, by outer electrodes spanning the outer sidewalls each pair of oppositely charged elements. A p-type element from one thermoelectric couple and a n-type element from a neighboring thermoelectric couple may be bridged by an inner electrode, electrically connecting the adjacent thermoelectric couples in series.

In some of the embodiments, electrodes couple adjacent p-type and n-type elements wherein a first (outer) electrode extends between a first p-type element and a first n-type element on the outer sidewall, and a second (inner) electrode extends between the first n-type element and a second p-type element on the inner sidewall. This arrangement may be arrayed into an electrode chain serially coupling all of the elements in the annular TEC. In some embodiments, the electrode chain is terminated by vias that extend from the terminal electrodes through the active layer of the IC die, where bond pads may be coupled to the vias for solder bonding the IC die to a package substrate. In some embodiments, a thermocouple is integrated into the active layer. The embedded annular TEC devices may be coupled to a TEC controller through the package substrate, which is also coupled to the thermocouple so that localized active cooling by the embedded annular TEC device may be provided on demand.

Here, the term "thermoelectric" generally refers to the property exhibited by certain materials to transfer heat across a gradient of electric charge within the material (e.g., the Peltier effect), or to transfer electric charge across a thermal gradient within the material (e.g., the Seebeck effect). The Peltier effect may be employed by the TEC devices disclosed herein to actively cool a region of an integrated circuit. A voltage may be applied to the TEC devices to create the internal charge separation within the device, producing a cold junction on one side of the charge gradient, and a hot junction on the opposite side of the charge gradient. 'Hot' and 'cold' refer to the relative temperatures of the two junctions. Heat reaching the cold junction is absorbed by the material and will diffuse as an internal flux across the charge gradient within the element to the hot junction, where it is rejected into the surrounding material of the IC die. This action may be referred to as heat-pumping action, since the internal flux is in a direction opposite that of passive diffusion of heat. The disclosed TEC device may be referred to as a heat pump. In some Peltier devices, a charge gradient is formed by a junction between a p-type element and an n-type element.

Here, the term "die" generally refers to a piece of semiconductor wafer that has been cut into rectangular sections referred to as dies. Each die has integrated circuitry on one or both sides. The term "active layer" generally refers to the integrated circuitry on the surface(s) of the die.

Here, the term "electrode" generally refers to the metallization on the TEC devices disclosed herein. Electrodes as used in this disclosure electrically connect thermoelectric elements together. Inner electrodes are on the inner sidewalls of the TEC device, and outer electrodes are on the outer sidewalls of the device.

Here, the term "thermal solution" generally refers to heat transfer components external to an IC package useful for thermal management of a high-power IC device, such as a microprocessor. These heat transfer components commonly comprise a heatsink, an integrated heat spreader and thermal interface materials. Other heat transfer components may be employed in a thermal solution.

Here, the term "substrate" refers to the substrate of an IC package. The package substrate is generally coupled to the die or dies contained within the package, where the substrate comprises a dielectric having conductive structures on or embedded with the dielectric. Throughout this specification, the term "package substrate" is used to refer to the substrate of an IC package.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "microprocessor" generally refers to an integrated circuit (IC) package comprising a central processing unit (CPU) or microcontroller. The microprocessor package is referred to as a "microprocessor" in this disclosure. A microprocessor socket receives the microprocessor and couples it electrically to the PCB.

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile", "plan", and "isometric" correspond to orthogonal planes within a cartesian coordinate system. Thus, cross-sectional and profile views are taken in the x-z plane, plan views are taken in the x-y plane, and isometric views are taken in a 3-dimensional cartesian coordinate system (x-y-z). Where appropriate, drawings are labeled with axes to indicate the orientation of the figure.

FIG. 1A illustrates a plan view of annular thermoelectric cooler (TEC) 100 embedded in die 101, according to embodiments of the disclosure.

In the embodiment illustrated in FIG. 1A, TEC 100 is a Peltier device that has a circular annular form factor. In some embodiments, the diameter of TEC 100 ranges from 500 microns to 2000 microns. In some embodiments, TEC 100 is within well 103 that extends a distance into the interior of die 101 from the surface of die backside 102. The top plane of TEC 100 is sunken below die backside 102, as indicated by the cut B-B' shown in FIG. 1B. In some embodiments, a fill material (not shown) covers TEC 100, extending from cut B-B' to the surface of die backside 102, embedding the device within the interior of die 101. In some embodiments, die 101 comprises a semiconductor material, such as, but not limited to, silicon (Si), silicon oxy-carbide (SiOC), silicon carbide (SiC), silicon-germanium alloy (SiGe), gallium arsenide (GaAs), gallium nitride (GaN), other III-V materials, such as indium phosphide (InP) or II-IV materials such as cadmium telluride (CdTe) and alloys thereof.

In the illustrated embodiment, TEC 100 comprises one or more thermoelectric materials segmented into adjacent wedge-shaped regions, or annular sectors, of alternating opposing charge types. In the illustrated embodiment, the white wedge-shaped regions 104 comprise p-type thermoelectric material, and the shaded (dark) wedge-shaped regions 105 comprise n-type thermoelectric material. Henceforth, the regions 104 and 105 will be referred to as p-type element 104 and n-type element 105. In some embodiments, p-type and n-type elements 104 and 105 are physically separate, having no junction between them. P-type and n-type elements 104 and 105 have outer sidewalls 108 along an outer perimeter and inner sidewalls 110 along an inner perimeter. The inner perimeter surrounds an interior (inner) region. The thermoelectric material of p-type and n-type elements 104 and 105, respectively, is confined between outer sidewall 108 and inner sidewall 110. In some embodiments, the distance between outer sidewalls 108 and inner sidewalls 110 ranges from 50 to 1000 microns.

The arclengths (in microns, indicated by the curved arrows in FIG. 1A) of p-type elements 104 and n-type elements 105 may depend on the circumference of TEC 100 and number of the individual thermoelectric elements that are comprised by TEC 100. The arclength of the thermoelectric elements may be the dividend of the circumference divided by the number of thermoelectric elements, assuming no gaps as shown for embodiments described below. As an example, the arclength of each of the eight thermoelectric elements may be approximately 400 microns for a TEC (e.g., TEC 100) having a diameter of 1000 microns. In some embodiments, p-type elements 104 may have different arclengths than n-type elements 105.

Suitable thermoelectric materials include, but are not limited to, bismuth chalcogenides, such as bismuth telluride ($Bi_2Te_3$) and bismuth selenide ($Bi_2Se_3$), antimony chalcogenides such as antimony telluride ($Sb_2Te_3$); bismuth-antimony chalcogenide alloys, such as p-type $Bi_xSb_{(2-x)}Te_3$ and n-type $Bi_2Te_{(1-x)}Se_x$; lead chalcogenides such as thallium-doped lead telluride (PbTe) and lead chalcogenide alloys such as p-type $PbTe_{(1-x)}Se_x$, and n-type $Pb_{(1-x)}Sn_xTe$. Suitable thermoelectric materials may further include clathrates such as $Ba_8Ga_{16}Ge_{30}$, or $Ba_8Ga_{16}Si_{30}$ and $Ba_8Ga_{16}Al_3Ge_{27}$; alloys of silicon-germanium ($Si_xGe_{(1-x)}$) such as $Si_{0.8}Ge_{0.2}$. Suitable thermoelectric materials may further include Skutterudite compounds such as (Co, Ni or Fe)(P, Sb or As) skutterudites, and rare earth-filled skutterudites such as $Ir_4XGe_3Sb_9$, where X is La, Nd or Sm. Suitable thermoelectric materials may further include transition metal oxides such as sodium cobaltite ($Na_xCoO$) and sodium cobaltate ($Na_{0.8}CoO_2$), zinc oxide (ZnO), manganese oxide ($MnO_2$) and niobium oxide ($NbO_2$), half Huesler compounds including NbFeSb, NbCoSn, VFeSb, strontium titanate/strontium oxide ($SrTiO_3$/SrO) Ruddlesden-Popper phase compounds. Suitable thermoelectric materials may further include amorphous systems such as Cu—Ge—Te, In—Ga—Zn—O, Zr—Ni—Sn, Si—Au and Ti—Pb—V—O. Other suitable thermoelectric materials are also possible. N-type and p-type doping of the materials may be done by introduction of heteroatoms or by alloy composition, as shown in the above examples.

In general, TEC 100 comprises at least one p-type element 104 and one n-type element 105, electrically coupled together as n-type/p-type thermoelectric pair or couple 106 by one of the outer electrodes 107 on outer sidewall 108. In the illustrated embodiment of FIG. 1A, TEC 100 comprises four thermoelectric couples 106, all of which are electrically coupled together in series by each of the inner electrodes 109 on inner sidewalls 110. In this disclosure, outer sidewall 108 and inner sidewall 110 may refer to either the outer sidewalls of the individual thermoelectric elements, and the outer sidewall of the TEC device as a whole. In some embodiments, outer sidewalls 108 and inner sidewall 110 have circular profiles within the illustrated plane. In some embodiments, outer and inner sidewalls 108 and 110, respectively, may have oval or elliptical profiles. Outer electrodes 107 and inner electrodes 109 form electrical junctions with the p-type and n-type elements 104 and 105, respectively. In some embodiments, outer electrodes 107 are between the sidewall of well 103 and outer sidewall 108 of TEC 100.

Inner electrode 109 extends along inner sidewall 110 between p-type element 104 of one p-type/n-type thermoelectric couple 106 to the n-type element 105 of an adjacent p-type/n-type thermoelectric element 106. It will be understood that in some embodiments the electrode arrangement may be reversed with no consequence to the functionality of TEC 100, where outer electrodes 107 connect thermoelectric couples 106 in series, and inner electrodes 109 interconnect adjacent individual p-type and n-type elements 104 and 105, respectively, into thermoelectric couples 106.

Outer electrode 107 and inner electrode 109 may comprise a conductive material such as, but not limited to, copper, aluminum, gold, silver, tungsten, tantalum or titanium. As will be shown in FIG. 1B, outer electrode 107 and inner electrode 109, as well as p-type element 104 and n-type element 105, have a depth dimension L that extends a distance in the z-direction below the plane of the FIG. 1A (x-y plane). In some embodiments, inner electrodes 109 and inner sidewall 110 surround interior region 111. In some embodiments, interior region 111 comprises a polycrystalline or amorphous fill material. In some embodiments, interior region 111 comprises a monocrystalline material, such as a region of native monocrystalline silicon of die 101. In some embodiments, the fill material may have a higher thermal conductivity than the thermoelectric materials of elements 104, 105. For such embodiments, interior region 111 may facilitate passive heat transfer along the depth dimension L while elements 104, 105 may facilitate active heat transfer in a lateral (e.g., radial or x) dimension. In some embodiments, interior region 111 covers inner electrodes 109 and inner sidewall 110. In some embodiments, interior region 111 comprises a semiconductor material, such as, but not limited to, silicon or any of the other semiconductor materials comprised by die 101 as described above. In some embodiments, the interior region 111 comprises a dielectric material, such as, but not limited to, silicon oxides such as silica, silicon nitride ($Si_3N_4$), aluminum nitride (AlN) or an organic polymeric material.

Tops of vias 113 are shown within interior region 111 and are bridged to terminal members of inner electrodes 109. As described below and shown in FIG. 1B, vias 113, indicated by the dashed circles, extend in the z-direction within interior region 111 to the front side of die 101. Vias 113 provide electrical interconnects for TEC 100 to bond pads (e.g., bond pad 114 in FIG. 1B) on the front side of die 101.

Figure 1B:
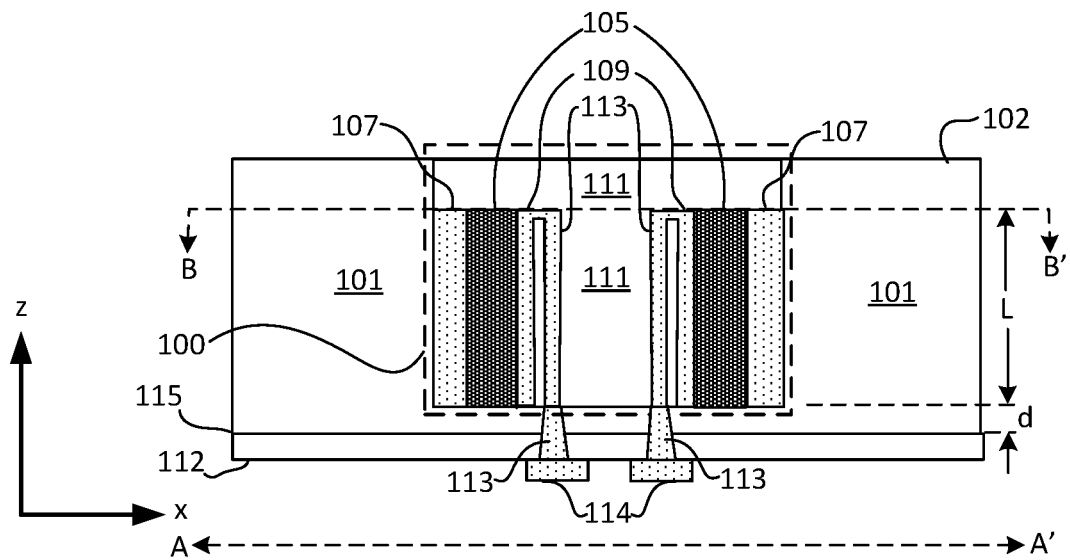
FIG. 1B illustrates a cross-sectional view of an annular thermoelectric cooler embedded in a die, according to embodiments of the disclosure.

FIG. 1B illustrates a cross-sectional view of annular thermoelectric cooler (TEC) 100 embedded in die 101, according to embodiments of the disclosure.

The cross-section in FIG. 1B is in the x-z plane and is taken as a slice along cut line A-A' in FIG. 1A. The view shows the depth of TEC 100 (delineated by the dashed box), where TEC 100 extends in the z-direction an unspecified distance from backside surface 102, approaching active layer 112 on die frontside 115. As the thickness of die 101 may range from 200 to 500 microns, the distance that TEC 100 may extend into the interior of die 101 in the z-direction (z-height) may be a substantial fraction of the thickness of die 101, as indicated by the distance L. As an example, the depth L of TEC 100 may range between 150 to 450 microns. In general, the depth or z-height (L) of TEC 100 is less than the thickness of die 101. TEC 100 extends within the interior of die 101 to a base level in the vicinity of active layer 112. In some embodiments, the base of TEC 100 generally does not extend into active layer 112 due to layout considerations of the overlying integrated circuit contained within active layer 112. In some embodiments, the base of TEC 100 is separated from active layer 112 by distance d. As an example, distance d is 50 microns. In some embodiments, the value of d ranges between 50 and 250 microns. The value of d may depend on fabrication considerations and/or heat transfer engineering considerations for optimal cooling of a hotspot in active layer 112. In general, the x and y coordinates of TEC 100 may be chosen to position TEC 100 relative to a potential hotspot within active layer 112. As an example, the x and y coordinates at the center of TEC 100 may coincide with a maximal density of power trace routing at a particular location within active layer 112, where heat buildup may be critical. For such an embodiment, there may be a perimeter of thermoelectric material surrounding a targeted hotspot, but not directly under the hotspot (with interior region 111 instead directly under the hotspot).

At least two interconnect vias 113 extend from each of two terminal members of the inner electrodes 109 through interior region 111 and through active layer 112. The terminal members of outer electrodes 107 may be any of the four electrodes shown in the illustrated embodiment. In some embodiments, interconnect via 113 is terminated by bond pad 114. Interconnect vias 113 and bond pads 114 may be positioned to align with bond pads on a package substrate (not shown in FIG. 1B; see FIG. 6) for flip-chip package assembly. As will be described below, interconnect vias 113 may couple TEC 100 to an external TEC controller for on-demand cooling, as described below and shown in FIG. 6. In some embodiments, vias 113 extend directly from the bases of electrodes 109 into the active layer. During operation of TEC 100, inner sidewalls 110 comprise the hot junction, and outer sidewalls 108 comprise the cold junction.

Figure 2:
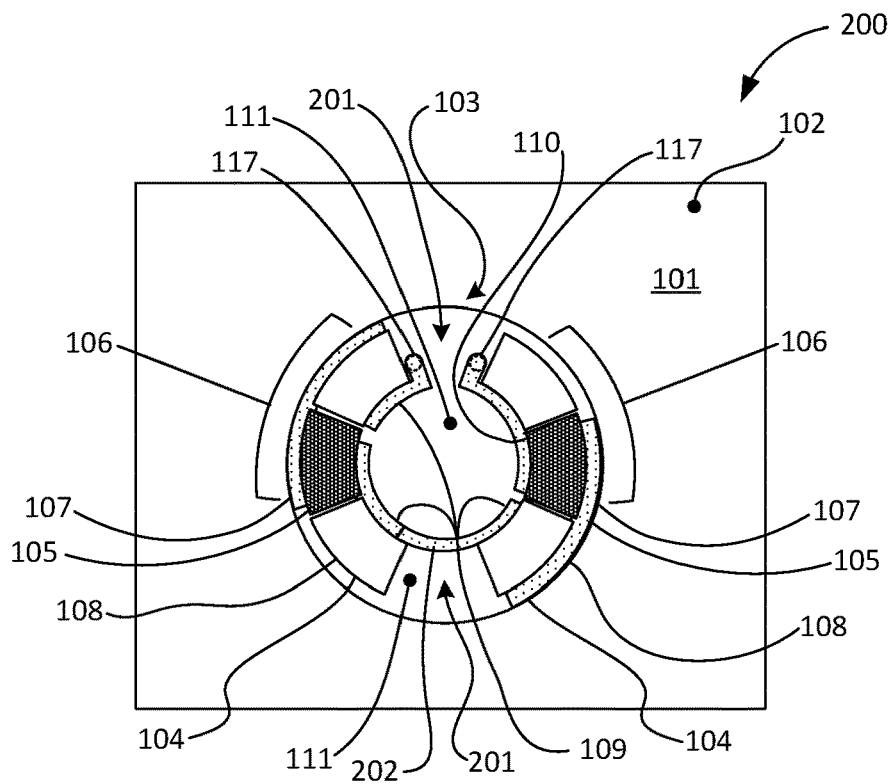
FIG. 2 illustrates a plan view of an annular thermoelectric cooler having two wide gaps separating thermoelectric segments that are electrically coupled in series embedded in a die, according to some embodiments of the disclosure.

FIG. 2 illustrates a plan view of annular TEC 200, having two wide gaps 115 separating thermoelectric segments of TEC 200 that are electrically coupled in series, according to some embodiments of the disclosure. In the illustrated embodiment of FIG. 2, the view of TEC 200 is from die backside 102, where TEC 200 is within well 103 extending in the z-direction below the plane (x-y) of the figure. As described above, TEC 200 may be sunken below the surface of die backside 102 and fully embedded in die 101.

TEC 200 comprises two semi-annular thermoelectric segments that comprise p-type elements 104 and adjacent n-type elements 105. The two semi-annular thermoelectric segments trace two arcs mirrored along a circular path, separated by gaps 201. The arclengths of the two semi-annular thermoelectric segments are exemplary. The arclengths may be taken as the circumference of the circular path enclosing TEC 200 minus the arclengths of the two gaps 201. In some embodiments, the diameter of TEC 200 ranges from 500 microns to 2000 microns. While three thermoelectric elements (e.g., p-type element 104 or n-type element 105) are shown for each thermoelectric segment, the number of physically separate p-type and n-type elements 104 and 105, respectively may vary according to the size of the thermoelectric elements relative to the diameter of TEC 200. The arclengths of gaps 201 may be adjusted accordingly.

The p-type elements 104 and n-type elements 105 may comprise at least one of the thermoelectric materials described above for the embodiment represented by TEC 100. Die 101 may comprise a semiconductor material as described above for TEC 100.

In the illustrated embodiment, outer electrodes 107 are along outer sidewalls 108 and cover a single thermoelectric couple 106 in each segment. Inner electrodes 109 along inner sidewalls 110 extend between thermoelectric couples 106, coupling the n-type elements 105 to the remaining p-type element 104 in each segment. Bridge trace 116 electrically joins inner electrodes 109 in each segment, thus coupling the two segments in series, so that outer electrodes 107 may couple both segments to terminal traces 117. In some embodiments, bridge trace 116 is a two-dimensional metal structure that extends along the surface of interior region 111 between inner electrodes 109, which are three-dimensional metal structures extending in the z-direction below the plane of the figure.

The dashed circles at the distal end of terminal traces 117 represent interconnect vias (e.g., interconnect vias 113, FIG. 1B) that extend from through the interior of die 101 to the front side of die 101, and through the active layer (e.g., active layer 112) on die frontside 115. Details of the architecture of TEC 200 in the z-direction are similar to those of TEC 100 shown in FIG. 1B, and will not be described separately. A single power source, such as a TEC controller (not shown; see FIG. 6), may be coupled to both thermoelectric segments though terminal traces 117. During operation of TEC 200, inner sidewalls 110 comprise the hot junction, and outer sidewalls 108 comprise the cold junction.

Terminal traces 117 extend as fingers from outer electrodes 107 over the surface of die backside 102 to interconnect vias represented by the dashed circles, that extend in the z-direction through the interior of die 101 to the front side. P-type and n-type elements 104 and 105, respectively, as well as outer and inner electrodes 107 and 109, respectively, extend a distance in the z-direction from the surface of die backside 102 to a level near the front surface of die 101. The conductive structures comprising outer and inner electrodes 107 and 109, respectively, bridge trace 116 and terminal traces 117 comprise a conductive material such as those described above.

Inner electrodes 109 and sidewall 110 partially surround interior region 111. In some embodiments, fill material as described above fills the unoccupied volume of well 103 with a material that comprises the native semiconductor material of die 101, extending in the z-direction a distance that is substantially the depth of well 103. In some embodiments, interior region 111 comprises a semiconductor material or a dielectric material as described above.

In some embodiments, each thermoelectric segment is an independent Peltier element providing localized heat pumping to actively remove heat from an adjacent hotspot. During operation of TEC 200, inner sidewalls 110 are the cold side of TEC 200, while outer sidewalls 108 are the hot side. Heat is absorbed by inner sidewalls 110 and rejected through outer sidewalls 108. Gaps 201 may provide a break in the active heat-pumping portions of TEC 200 to reduce the cooling effect if the thermoelectric material(s) is (are) highly efficient (e.g., so as not to drop the temperature of the die too quickly that would induce rapid thermal contraction of the active layer or the die region immediately adjacent thereto, causing possible damage to the integrated circuit).

Figure 3:
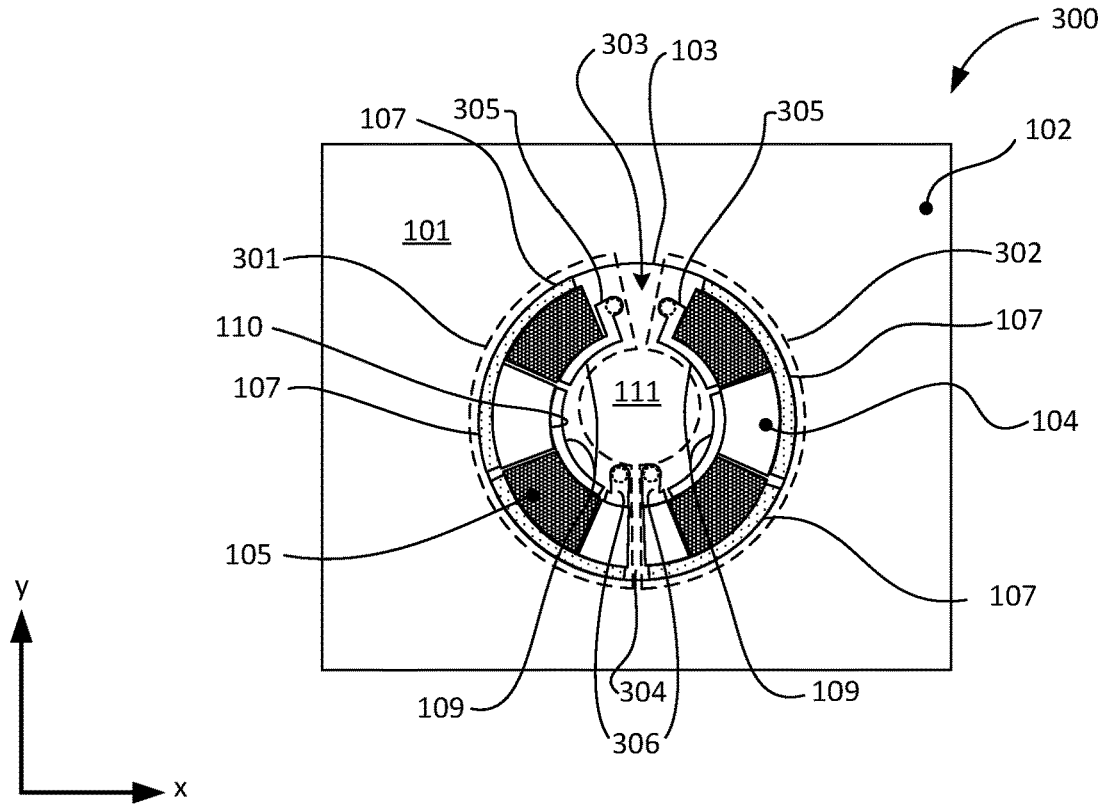
FIG. 3 illustrates a plan view of an annular thermoelectric cooler having two independent thermoelectric annular segments embedded in a die, according to some embodiments of the disclosure.

FIG. 3 illustrates a plan view of TEC 300 having two independent thermoelectric annular segments, according to some embodiments of the disclosure.

In the illustrated embodiment of FIG. 3, TEC 300 comprises two segments 301 and 302, each delineated by the dashed enclosures. Segments 301 and 302 are separated from each other by gaps 303 and 304, which are asymmetric, according to some embodiments. Segments 301 and 302 are electrically independent, having terminal traces 305 and 306 extending from terminal members of inner electrodes 109 extending along inner sidewalls 110 on segments 301 and 302. Segments 301 and 302 comprises p-type elements 104 coupled to adjacent n-type elements 105 through inner electrodes 109 and outer electrodes 107. P-type and n-type elements 104 and 105 may be physically separate so that there is no junction between them. In the illustrated embodiment, the TEC assembly is contained within well 103, and extends a distance in the z-direction below the plane of the figure to a level near the front side of die 101, where the distance is less than the thickness of die 101. Details of architecture of TEC 300 in the x-z and y-z planes are similar to those described for TEC 100, and shown in FIG. 1B.

In the illustrated embodiment, segments 301 and 302 each comprise two thermoelectric couples 106, where each thermoelectric couple 106 comprises a p-type element 104 and a n-type element 105. As described above, p-type elements 104 are physically isolated from adjacent n-type elements 105, according to some embodiments, but are electrically coupled together through outer electrode 107. Thermoelectric couples 106 are electrically coupled to each other within a segment by one inner electrode 109. The terminal elements (p-type element or n-type element) of thermoelectric couples 106 are coupled to terminal traces 305 and 306 through the two terminal members of inner electrodes 109. During operation of TEC 300, inner sidewalls 110 comprise the hot junction, and outer sidewalls 108 comprise the cold junction.

Terminal traces 305 and 306 extend over and within interior region 111 within the interior region of TEC 300 surrounded by inner electrodes 109 and inner sidewall 110. Interior region 111 comprises a semiconductor material or dielectric material. Suitable semiconductor and dielectric materials have been described above. The dashed circles at the ends of terminal traces 305 and 306 represent interconnect vias (e.g., interconnect vias 113 in FIGS. 1A and 1B) that extend in the z-direction through interior region 111 to the front side of die 101. In some embodiments, the interconnect vias extend through the active layer (e.g., active layer 112 in FIG. 1B) to terminate at die front-side contact pads (e.g., contact pads 114 in FIG. 1B). In alternative embodiments, terminal traces extend over interior region 111 to die backside 102. Interconnect vias may extend through the interior of die 101 to reach the active layer on the front side of die 101 (see FIG. 1B).

Segments 301 and 302 may be independently coupled to separate power sources for independent control. TEC 300 may be operated as an asymmetric heat pump device, providing an asymmetric temperature gradient within the interior region surrounded by inner sidewall 109. An asymmetric temperature gradient may be useful for large-diameter annular TEC devices (e.g., TEC 300), where the interior region surrounded by a large-diameter (e.g., 2 mm) annular TEC may control the heat flux and temperature of a large region of the active layer directly above the interior region of the die interior, which the annular TEC surrounds. As an example, a hotspot may be located off-center relative to single large annular TEC (e.g., TEC 300) that is integrated into a die such as die 101 according to some embodiments. The hotspot may be nearer to one segment than the other. Strong heat-pumping action may be desired close to the hotspot, whereas lighter heat-pumping action or no heat-pumping action may only be required in portions within the interior region surrounded by TEC 300 further from the hotspot.

Figure 4:
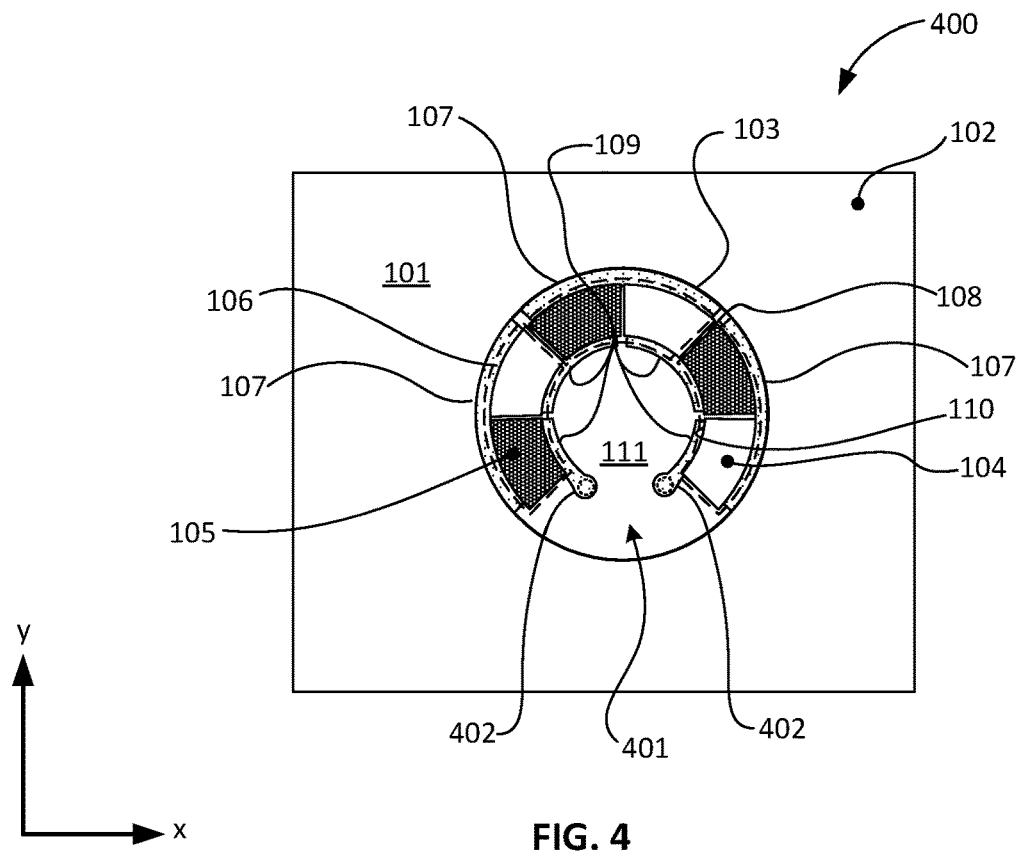
FIG. 4 illustrates a plan view of an annular thermoelectric cooler having a single gap embedded in a die, according to some embodiments of the disclosure.

FIG. 4 illustrates a plan view of annular TEC 400 integrated into die 101 having a single gap, according to some embodiments of the disclosure.

In the illustrated embodiment of FIG. 4, TEC 400 comprises a single thermoelectric segment comprising alternating p-type and n-type elements 104 and 105, respectively, following a circular arc. In some embodiments, p-type elements 104 are physically separated from adjacent n-type elements 105. Gap 401 is between a terminal p-type element 104 and a terminal n-type element 105, wherein TEC 400 has an open annular (e.g., C-shaped) structure. While FIG. 4 shows that TEC 400 has six thermoelectric elements (e.g., three p-type elements 104 and three n-type elements 105), it will be understood that the number of thermoelectric elements may be any suitable number that is determined by the size of the elements 104 and 105, the size of gap 401 and the diameter of TEC 400.

Outer electrodes 107 cover portions of outer sidewall 108 on the exterior of thermoelectric couples 106 (delineated by the dashed outlines) that comprises one p-type element 104 and one adjacent n-type element 105. Inner electrodes 109 interconnect thermoelectric couples in series by spanning inner sidewall 110 between the elements on neighboring thermoelectric couples 106 (e.g., interconnecting the p-type element 104 of one thermoelectric couple 106 to the n-type element 105 of an adjacent thermoelectric couple 106). It will be understood that the role of outer electrodes 107 and inner electrodes 109 may be reversed. In some embodiments, inner electrodes 109 span neighboring p-type and n-type elements within individual thermoelectric couples 106, where the individual thermoelectric couples 106 are interconnected in series by outer electrodes 107. During operation of TEC 400, inner sidewalls 110 comprise the hot junction, and outer sidewalls 108 comprise the cold junction.

Terminal traces 402 extend over and within interior region 111 from inner electrodes 109 on terminal thermoelectric elements. Dashed circles on the distal portions of terminal traces represent interconnect vias (e.g., interconnect vias 113, FIG. 1B) that extend in the z-direction through interior region 111 and intervening interior of die 101, to reach the active layer (e.g., active layer 112, FIG. 1B) on die frontside 115. In some embodiments, the indicated interconnect vias may extend directly from the base of terminal members of inner electrodes 109 into the active layer on the die frontside 115, as shown in FIG. 1B (not shown in FIG. 4).

As described above (e.g., shown in FIG. 1B), interconnect vias may terminate at bond pads (e.g., bond pad 114, FIG. 1B) located on the die frontside 115, where die 101 may be flip-chip bonded to a package substrate. TEC 400 may be coupled to routing within the package substrate that is to couple to a TEC controller (e.g., see FIG. 6). In some implementations, a thermocouple element is within the vicinity of TEC 400, and provides temperature signal to the TEC controller, whereby the TEC controller provides on-demand cooling.

Referring again to FIG. 4, gap 401 may provide a passive region on one side of TEC 400, reducing the cooling efficiency of TEC 400 during operation and creating an asymmetric temperature gradient within the inner portion of TEC 400 surrounded by inner sidewall 109. A potential hotspot may be situated closer to inner sidewall 109 than gap 401. The reduced cooling efficiency and asymmetric temperature gradient may be desired when rapid cooling is to be avoided so as not to impede operation of surrounding circuit components in regions of the active layer encompassed by TEC 400 that are not overheating. An asymmetric temperature gradient may be optimal for the cooling pattern of a large-diameter TEC. As an example, TEC 400 may be asymmetrically situated over a hotspot, where the hotspot is in closer proximity to inner sidewall 109 than to gap 401. In this way, cooling may be more localized to the hotspot, and weaker or non-existent in other parts of the integrated circuitry near or within a region over gap 401. In these regions of the active layer, temperatures must remain between prescribed limits to maintain normal operation. During operation, TEC 400 may lower the temperatures to below operational limits near inner sidewall 109.

In some embodiments, interior region 111 of TEC 400 comprises a polycrystalline or amorphous fill material, which has been described in detail above. In some embodiments, the fill material is monocrystalline, where native monocrystalline semiconductor material may remain within well 103. When viewed from the front side of die 101, TEC 400 may be positioned below a potential hotspot within the active layer, where the inner portion of TEC 400, surrounded by inner sidewall 110, encompasses a region of die 101 below the potential hotspot. As described above, during operation of TEC 400, heat from the hotspot is conducted into the interior of die 101 by interior region 111 and diffuses to the hot junction on inner sidewall 109, where it is actively absorbed into the body of TEC 400. Heat is then rejected into the interior regions of die 101 through the cold junction on outer sidewall 108. The rejected heat is conducted by the semiconductor material of die 101 external to TEC 400 to die backside 102, where a thermal solution is interfaced with die backside 102. Generally, a thermal interface material, such as a thermal grease, is between die backside 102 and an integrated heat spreader lid that is interfaced with a heat sink. Eventually, the heat is to be dissipated to the environment by the heat sink.

Figure 5:
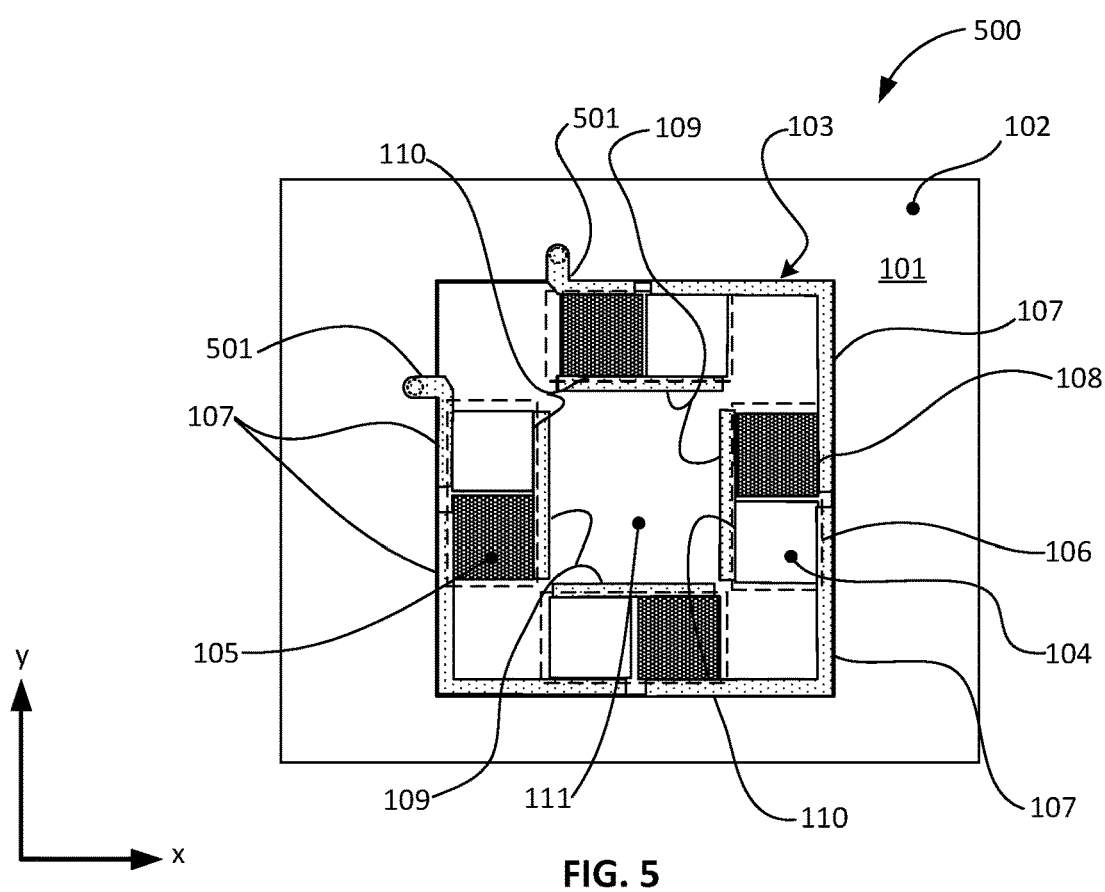
FIG. 5 illustrates a plan view of annular thermoelectric cooler having a rectilinear form factor embedded in a die, according to some embodiments of the disclosure.

FIG. 5 illustrates a plan view of annular TEC 500, having a rectilinear form factor, according to some embodiments of the disclosure.

In the embodiment illustrated in FIG. 5, TEC 500 is four-sided structure as viewed in the x-y plane, comprising four interconnected linear segments of alternating p-type elements 104 and n-type elements 105. The adjacent linear segments extend in orthogonal directions following rectangular path, where each segment is the side of the rectangle, according to some embodiments. In some embodiments, the number of linear segments may be fewer than four or more than four, following polygonal paths defining a triangle, a diamond, a pentagon, hexagon, etc. In the illustrated embodiment, the four segments surround an interior region 111. In some embodiments, interior region 111 comprises a polycrystalline or amorphous fill material. TEC 500 is confined within well 103, and extends in the z-direction a distance (e.g., z-height L in FIG. 1B) below the surface of die backside 102. The z-height distance is less than the thickness of die 101, where TEC 500 has a base region that is separated from the active layer by a distance (e.g., distance d in FIG. 1B). In some embodiments, TEC 500 is sunken below the surface plane of die backside 102, and is embedded by fill material that may be planarized with the surface of die backside 102, as shown for TEC 100 in FIG. 1B. The details of the structure of TEC 500 in the x-z plane are similar to those described above for TEC 100, and shown in FIG. 1B. In the volume not occupied by TEC 500 (e.g., interior region 111 and/or other spaces), well 103 may be backfilled with a fill material.

Inner electrodes 109 extend along inner sidewalls 110, spanning over adjacent p-type and n-type elements 104 and 105, respectively, within thermoelectric couples 106 (delineated by the dashed outlines). Inner electrodes 109 electrically interconnect and provide a junction for p/n element pairs with a thermoelectric couple. In an alternate fashion, outer electrodes 107 extend along outer sidewalls 108, spanning between neighboring p-type and n-type elements 104 and 105, respectively, of adjacent thermoelectric couples 106. Outer electrodes 107 electrically interconnect adjacent thermoelectric couples 106 in series, and are shown to be bent at right angles to extend along the corners of TEC 500 between thermoelectric couples 106. In some embodiments, outer electrodes 107 follow the orthogonal edges of the elements of adjacent thermoelectric couples 106 to extend the cold junction of TEC 500. Outer electrodes 107 may equally extend diagonally between thermoelectric couples 106. During operation of TEC 500, inner sidewalls 110 comprise the hot junction, and outer sidewalls 108 comprise the cold junction.

Terminal traces 501 extend from terminal members of outer electrodes 107 over interior region 111 or over the surface of die backside 102 near well 103. The dashed circles at the distal ends of terminal traces 501 represent interconnect vias (e.g., interconnect vias 113, FIG. 1B) that extend in the z-direction through the interior of die 101 to reach the active layer on the front side of die 101 (e.g., active layer 112, FIG. 1B). In some embodiments, interconnect vias extend from the base of terminal members of inner electrodes 109 near the active layer, as shown in FIG. 1B. Inner sidewalls 110 and inner electrodes 109 surround the interior region 111 of TEC 500. In some embodiments, pairs of terminal traces (e.g., terminal traces 501) may extend from outer electrodes 107 from each individual thermoelectric couple 106. In this manner, each thermoelectric couple 106 may be controlled separately to provide selective cooling to the interior region of TEC 500.

As described above, interconnect vias (e.g., interconnect vias 113) may terminate at bond pads (e.g., bond pads 114, FIG. 1B) located on the front side of die 101, where die 101 may be flip-chip bonded to a package substrate. TEC 500 may be coupled to routing within the package substrate that is to couple to a TEC controller (e.g., see FIG. 6) through a package substrate to which die 101 may be solder-bonded. In some implementations, a thermocouple element is within the vicinity of TEC 500, and provides temperature signal to the TEC controller, whereby the TEC controller provides on-demand cooling.

Figure 6:
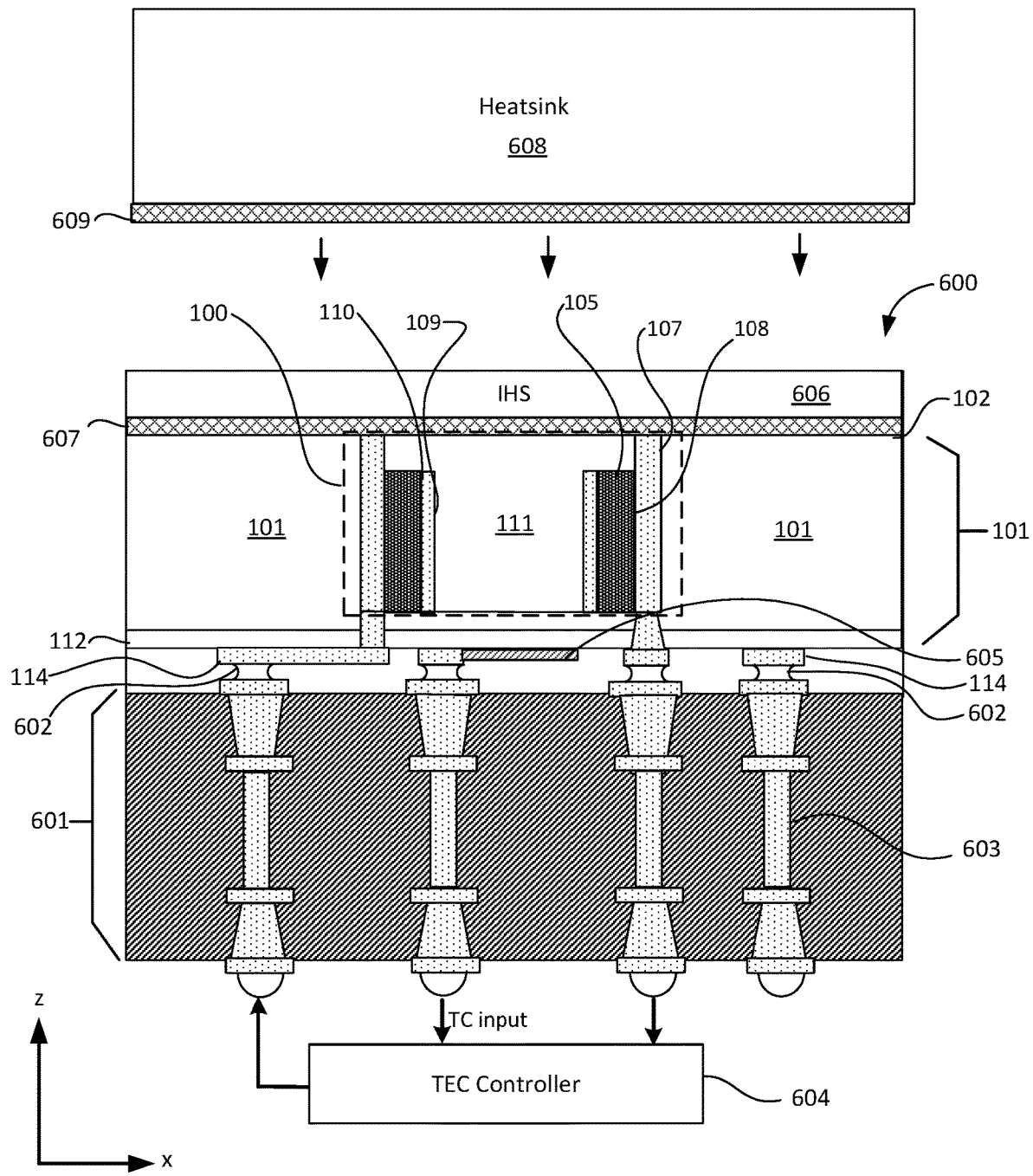
FIG. 6 illustrates a cross-sectional view of a package comprising a die having an embedded annular thermoelectric cooler, according to some embodiments of the disclosure.

FIG. 6 illustrates a cross-sectional view of package 600 comprising die 101 having an integrated annular TEC 100, according to some embodiments of the disclosure.

In the illustrated embodiment of FIG. 6, die 101 comprising annual TEC 100 embedded within die 101 according to some embodiments is mounted on package substrate 601 and encased within package 600. Bond pads 114 provide interconnections for TEC 100 through solder joints 602 and substrate vias 603, coupling to TEC controller 604. The routing to TEC controller 604 is shown schematically.

In some embodiments, thermocouple 605 is integrated within active layer 112 for measuring the local temperature. Thermocouple 605 may be coupled to TEC controller 604 through conductive routing within package substrate 601 to provide a temperature signal. TEC controller may throttle or increase the current that is routed to TEC 100 in order to drive the local temperature to a set point value by controlling the heat flux through the thermoelectric elements (e.g., p-type element 104, not shown, and n-type element 105).

TEC 100 pumps heat from the hot junction on inner sidewall 110 where heat is absorbed, to the cold junction on outer sidewall 108, where heat is rejected to the interior of die 101. TEC controller 604 controls the voltage on the terminal members of inner electrodes 109, and therefore the current running through TEC 100.

According to some embodiments, rejected heat is conducted through the interior of die 101 following a thermal gradient leading to die backside 102, In some embodiments, die backside 102 is interfaced to integrated heat spreader (IHS) 606 through an intervening layer of thermal interface material (TIM) 607, which provides an interface having a low thermal resistance. In some embodiments, a second TIM layer 609 is sandwiched between IHS 606 and heat sink 608 to ensure good thermal contact between package 600 and heatsink 608.

Figure 7:
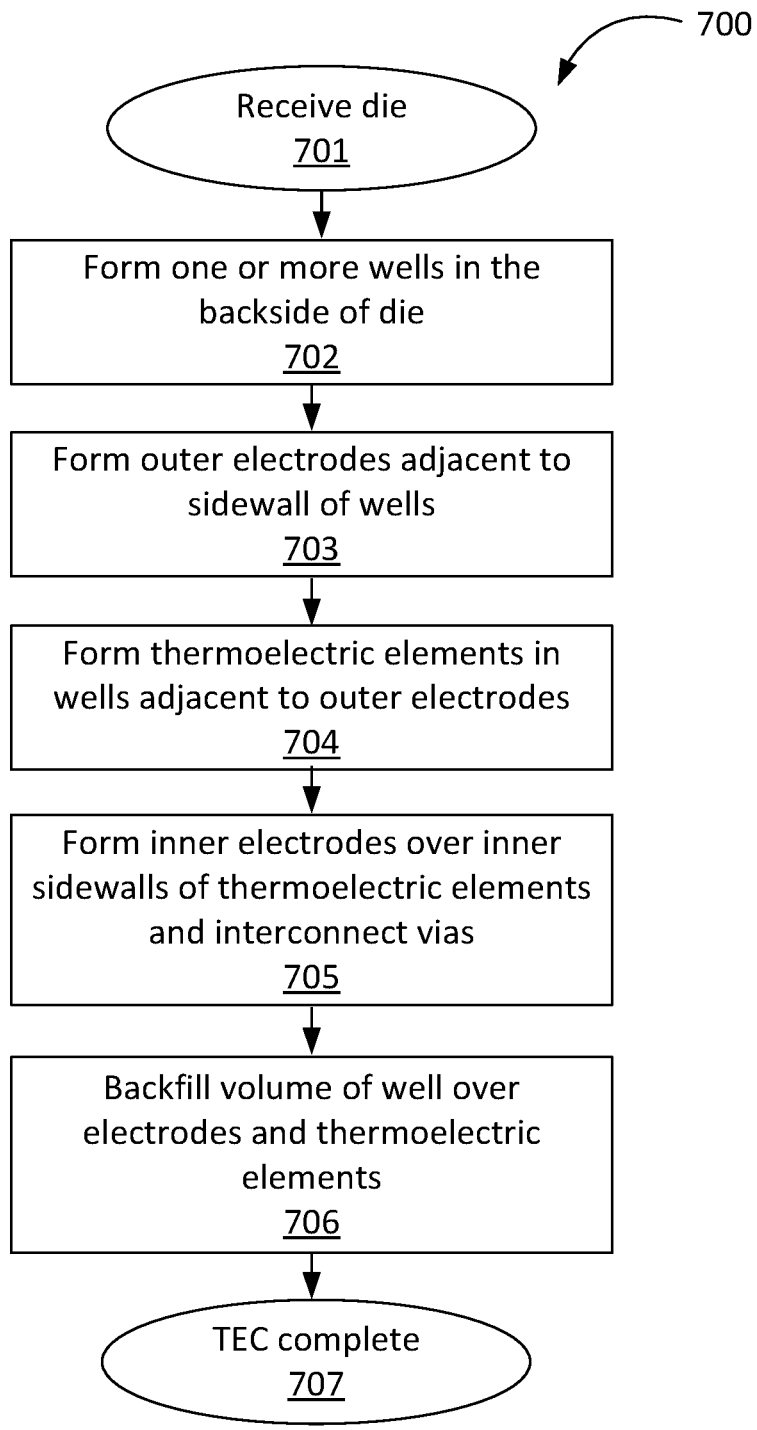
FIG. 7 illustrates a block diagram summarizing an exemplary method for the formation of an annular thermoelectric cooler embedded in a die, according to some embodiments of the disclosure.

FIG. 7 illustrates block diagram 700, summarizing an exemplary method for the formation of TEC 100, according to some embodiments of the disclosure.

In operation 701, one or more semiconductor dies (e.g., die 101) are received. The one or more semiconductor dies may be part of a larger semiconductor wafer that is to be diced to liberate individual dies in an end-of-process operation. The semiconductor material comprised by the one or more dies comprises any of silicon, germanium, gallium arsenide, gallium nitride, or gallium phosphide, but are not limited to these materials and other suitable materials are possible. Further, the one or more dies may have been received with an active layer (e.g., active layer 112) comprising integrated circuitry mostly or fully fabricated on one side of the dies (e.g., the front side).

In operation 702, one or more wells (e.g., well 103) are formed on the backside of the one or more dies (e.g., die backside 102) that is opposite the front side and the active layer. The wells may be formed by any suitable process, such as, but not limited to, deep reactive ion etching (DRIE), laser drilling or mechanical drilling. The depth of the one or more wells may extend a distance into the interior of the die that is less than the thickness of the die, so as not to extend completely though the die. In some embodiments, the bottom of the well is at a distance of 50 microns to 200 microns of separation from the active layer. The distance chosen may depend on heat transfer and other engineering considerations. The lateral position(s) of the one or more wells may be aligned with the integrated circuitry to coincide with the positions of potential hotspots.

In operation 703, the outer electrodes (e.g., outer electrodes 107) for the embedded annular TEC (e.g., TEC 100) are formed. The outer electrodes (as well as the inner electrodes 109 and interconnect vias 113 to be formed in subsequent steps) comprise a conductive metallic material, such as copper. In the present operation, the metal is electrodeposited by galvanic electroplating or electroless deposition. In this exemplary operation, a thick photoresist, such as SU8, is deposited over the die backside. The photoresist may be spin-coated or spay-coated onto the surface of the die backside. During deposition, the resist may fill the one or more wells. After a soft bake, a photolithographic mask, exposure and develop process may be employed to form lithographically-defined openings in the photoresist that is within the one or more wells.

In preparation of the electrodeposition, a conductive seed layer is formed first preceding electroplating, or a catalytic layer comprising platinum ions is formed before electroless deposition. The bulk metallic material may then be electrodeposited by through-mask electroplating or by electroless deposition with the lithographically-defined openings to form the outer electrodes. The outer electrodes may be directly adjacent to and follow the contour of the sidewall(s) of the one or more wells.

In operation 704, the thermoelectric elements (e.g., p-type element 104 or n-type element 105) are formed. P-type and n-type thermoelectric elements may be formed separately in sequential operations. Thus, by way of example, a mask is prepared for the p-type thermoelectric elements and a separate mask is prepared for the n-type thermoelectric elements in a particular TEC embodiment. The p-type thermoelectric elements are interleaved with the n-type thermoelectric elements, such that a p-type element is adjacent to a n-type element.

A through-mask deposition process similar to that used for electrodeposition of the electrodes may be used to form the thermoelectric elements. The previous thick resist is removed, and a new layer of thick photoresist is deposited. Lithographically-defined openings may be made within the one or more wells, where the opening pattern is displaced inwardly from the outer electrodes, and follows the layout of the TEC to be formed (e.g., TEC 100). As an example, a first set of openings may be formed for deposition of the p-type elements.

The material for the first set of thermoelectric elements (e.g., p-type elements 104), such as bismuth telluride or silicon germanium alloy, or any of the thermoelectric materials described above, may be formed by any suitable process, including, but not limited to, electrodeposition, chemical vapor deposition, or sputtering. The doping type may be controlled by the composition of the material. Once the first set of thermoelectric elements are deposited, the set of operations may be repeated with a second mask to form the second set of thermoelectric elements (e.g., n-type elements 105). The p-type and n-type thermoelectric elements are structurally isolated, but may be integral with the outer electrodes to form electrical junctions therewith over the outer sidewalls (e.g., outer sidewalls 108). The outer electrodes may span across the outer sidewalls of neighboring p-type and n-type elements to form thermoelectric couples.

In operation 705, the inner electrodes (e.g., inner electrodes 109) are formed over the inner sidewalls of the thermoelectric elements (p-type and adjacent n-type elements 104 and 105, respectively). In a manner similar to the formation of the outer electrodes, the inner electrodes may be electrodeposited in a through-mask process. The inner electrodes may be integral with the inner sidewalls (e.g., inner sidewalls 110) of the thermoelectric elements, such that electrical junctions are formed between the thermoelectric elements and the inner electrodes. The inner electrodes may have an angular offset from the outer electrodes such that the inner electrodes interconnect neighboring p-type and n-type elements from adjacent thermoelectric couples, electrically coupling the thermoelectric couples in series.

Interconnect vias (e.g., interconnect vias 113) may be formed simultaneously with the inner electrodes, or in a subsequent operation, to extend in the z-direction from within the interior region surrounded by the inner sidewalls (e.g., inner sidewalls 110) and the inner electrodes. Lithographically-defined openings that extend to the bottom of the one or more well may be formed in the photoresist layer within the interior region. Interconnect vias may extend through the active layer of the die. By way of example, land-side bond pads (e.g., bond pad 114) and vias extending therefrom into the die may be made through the active layer in a previous operation. The lithographically-defined openings may be aligned with the previously formed vias in the active layer to form a single via extending from the die backside to the associated bond pad in the active layer.

Openings for the interconnect vias (e.g., interconnect vias 113) may be widened at the upper portion, near the backside of the die (e.g., die backside 102), to meet the sidewall of terminal members of the inner electrodes. When formed, the interconnect vias and the terminal inner electrodes become electrically contiguous structures. In this way, the interconnect vias may provide the electrical interconnections to the package substrate (e.g., package substrate 601).

In some embodiments, interconnect vias may be formed as direct extensions of the terminal inner electrodes through the active layer. The vias may be integrated directly with the portions of the terminal inner electrodes adjacent to the active layer and extend through the active layer to the bond pads.

In operation 706, the TEC is mostly formed within the one or more wells. The photoresist layer may be removed, and the one or more wells backfilled with a suitable fill material. Suitable fill material choices have been described above. As an example, the fill material may be the same as the semiconductor material of the die. The unoccupied volume of the one or more wells may be substantially backfilled with the fill material. This operation may be necessary for proper functioning of the TEC for efficient active removal of the heat generated locally by a hotspot during operation of the device of which the die is part, such as a microprocessor. The cold junction of the TEC is on the inner sidewall. Contact of the cold junction with a material that has an adequate thermal conductivity increases the cooling performance of the TEC device (e.g., TEC 100). During operation of the TEC device, rejected heat is conducted away from the cold junction (e.g., inner sidewalls 110 of the thermoelectric elements) through the fill material with the one or more wells, eventually to be removed from the die through backside contact with a thermal solution, as described above and shown in FIG. 6.

In some embodiments, interconnect vias (e.g., interconnect vias 113) may be formed after deposition of the fill material.

In operation 707, the fabrication of the embedded annular TEC device is complete. If the above operations have been carried out at wafer level, the wafer may further processed to complete fabrication of the integrated circuitry, or if the TEC fabrication is performed after formation of the active layer, the wafer may be diced to liberate the individual dies. Subsequently, the dies may be attached to package substrates to form the package, as illustrated in FIG. 6.

In the following paragraphs, a detailed description is given for the exemplary method for making annular TEC 100 summarized in FIG. 7.

FIGS. 8A-8L illustrate an exemplary method for making annular TEC 100 embedded within die 101, according to some embodiments of the disclosure.

In the operation illustrated in FIG. 8A, die 101 is received. Die 101 may be a diced from a whole wafer in an end-of-process operation. The subsequent operations described below may be performed at wafer level before individual dice are cut. The following description refers to die 101 as an individual die, but it will be understood that die 101 may be a lithographically-defined region of a whole semiconductor wafer that undergoes the following process operations.

In some embodiments, die 101 comprises active layer 112 on die frontside 115, opposite of die frontside 102. Active layer 112 may comprise one or more integrated circuits comprising very large-scale integration (VLSI) of power devices that have been fabricated over the front side of die 101. In some embodiments, die 101 is received without integrated circuitry yet formed. In some embodiments, die 101 comprises a semiconductor material such as those that have been disclosed above.

In the operation illustrated in FIG. 8B, well 801 is formed on die backside 102, extending into the interior of die 101. Well 801 may be a round (e.g., circular) well having a single sidewall, or a polygonal (e.g., rectangular) well having three or more linear sidewalls. The depth of well 801 extends in the z-direction a distance that is less than the thickness of die 101, leaving a distance d between the bottom of well 801 and active layer 112. In some embodiments, distance d is 50 microns. In some embodiments, distance d is between 50 microns and 250 microns. Well 801 may be formed by any suitable method, including, but not limited to, deep reactive ion etching (DRIE), wet chemical etching, such as a potassium hydroxide (KOH) etch to form cavities of arbitrary shape. Methods may further include laser drilling or mechanical drilling to form circular cavities. Etching methods employ lithographically defined etch masks that are formed in photoresist layers or etched gold or copper layers. Positioning of well 801 relative to devices within active layer 112 may coincide with the positions of potential hotspots.

In the operation illustrated in FIG. 8C, a photoresist 802 is deposited within well 801. The photoresist material may be a thick epoxy resin-based resist, such as SU8. Photoresist 802 may be spin-coated or spray-coated onto die backside 102, then subjected to a heat treatment (e.g., soft bake).

In the operation illustrated in FIG. 8D, photoresist 802 has been patterned to form first openings 803. In the illustrated embodiment, first openings 803 extend from well sidewall(s) to a distance $x_1$ into the interior of well 801, where first openings 803 define the thickness and shape of TEC outer electrodes (e.g., outer electrodes 107) that are to be electroplated into first openings 803 in a subsequent operation. In some embodiments, first openings 803 have a z-height that is the full depth of well 801. In alternate embodiments, first openings 803 have a z-height that is less than the depth of well 801.

In the operation illustrated in FIG. 8E, outer electrodes 107 are formed by deposition of a conductive material into first openings 803 formed within photoresist 801 in the previous operation. Electrodes 107 may comprise a conductive material that comprises a metal, such as, but not limited to, copper, gold, silver, nickel, cobalt or aluminum. Suitable deposition methods include, but are not limited to, galvanic electroplating and electroless deposition. Galvanic electroplating may be preceded by formation of a conductive seed layer within first openings 803 and over the surface of die backside 102. During electroplating, material may be deposited within the openings (e.g., first openings 803) and over die backside 102. Excess material (e.g., on die backside 102) may be removed by a flash etch or other suitable etch technique, leaving outer electrodes 107 intact.

Formation of a catalytic layer may precede electroless deposition. A catalytic layer suitable for electroless deposition of copper, gold silver or nickel may comprise platinum. A photolithographic step may be necessary to pattern the catalytic layer to confine electroless deposition into openings (e.g., first openings 803) in photoresist 802, or a layer of metal may be deposited over die backside 102, then removed by an etch step as described for the electroplating process.

In a subsequent operation, a plurality of second openings 804 are formed in photoresist 802 for the formation of thermoelectric materials. Second openings 804 may extend laterally a distance $x_2$ from the sidewalls of outer electrodes 107 into photoresist 802. Second openings 804 may also extend in the z-direction to the bottom of the well 801, formed in operation illustrated in FIG. 8B as described. The pattern of second openings 804 may coincide with the pattern of n-type or p-type thermoelectric elements as shown in FIG. 1A.

In the operation illustrated in FIG. 8F, thermoelectric elements (e.g., n-type elements 105) are formed from a suitable thermoelectric material deposited within second openings 804 formed in the previous operation as described. Suitable thermoelectric materials have been described in detail above. In some embodiments, a suitable thermoelectric material such as bismuth telluride or silicon germanium is electrodeposited into second openings 804. In some embodiments, thermoelectric material is deposited by chemical vapor deposition into second openings 804. In some embodiments a suitable thermoelectric material is sputter deposited into second openings 804. A photoresist or other type of mask may be deposited over die backside 102 to remove excess thermoelectric material over the surface, or excess material may be removed by an etch step subsequent to the deposition operation. Doping of the thermoelectric material to form n-type or p-type conductivity may be controlled by adjusting the composition of the material.

Post formation of n-type elements 105 (or p-type elements 104), adjacent thermoelectric elements (e.g., p-type elements 104, as shown in FIG. 1A) may be formed. In a subsequent operation (not shown), photoresist 802 may be removed and re-deposited into an interior region of the well (e.g., well 801). Re-deposited photoresist 802 within well 801 may undergo a second lithographic patterning operation to form a second plurality of openings 804 adjacent to each n-type element 105 (or p-type element 104). Within the second plurality of openings 804, thermoelectric material of opposing conductivity type may be deposited as described above, forming p-type elements (e.g., p-type elements 104), or n-type elements if p-type elements had been formed initially. Once the second thermoelectric elements are deposited, an annular thermoelectric chain that is the core of TEC 100 has been formed.

In the operation illustrated in FIG. 8G, a third deposition of photoresist 802 into well 801 is patterned to form a plurality of third openings 805 that extend laterally from inner sidewalls 110 into the interior of photoresist 802. The distance of lateral extent (not indicated) of third openings 805 defines the thickness of inner electrodes (e.g., inner electrodes 109) to be formed in a subsequent operation. Third openings 805 may have a z-height that extends partially or completely to the bottom of well 801, separated from active layer 112 by distance d.

In the operation illustrated in FIG. 8H, inner electrodes 109 are deposited into third openings 805. Inner electrodes 109 comprise a conductive material, such as copper, as described above for outer electrodes 107. Inner electrodes 109 may be deposited by a suitable method such as electroplating or electroless deposition. A seed layer or catalyst layer may be deposited prior to electrodeposition.

In the operation illustrated in FIG. 8I, a fill material is deposited in the interior region surrounded by inner electrodes 109 and inner sidewall 110, replacing photoresist 802. Photoresist 802 may be removed by a suitable photoresist removal process. In some embodiments, the fill material comprises a polycrystalline semiconductor material. In alternate embodiments, the fill material comprises a polycrystalline or amorphous dielectric material. In some embodiments, interior region 111 comprises native monocrystalline semiconductor material (e.g., Si) that remains in well 103 after the etch process. In some embodiments, interior region 111 comprises a high-k material that has a larger thermal conductivity than that of the thermoelectric material. Suitable materials for fill material have been described in greater detail above. The fill material may be deposited by suitable methods including, but not limited to, chemical vapor deposition and sputtering, extending in the z-direction to depth L of well 801.

In the operation illustrated in FIG. 8J, interconnect vias 113 are formed within interior region 111 from a conductive material such as copper. In some embodiments, openings are formed within interior region 111 by deep etching through a lithographically-defined etch mask. A suitable etch process may include DRIE. Openings for interconnect vias 113 may extend laterally to the sidewalls of terminal members of inner electrodes 109, forming a bridging portion that will allow vias 113 to be integral with inner electrodes 109. The openings may extend a distance less than L in the z-direction. Interconnect vias 113 be may be formed by electroplating or by electrodeposition as described above, forming integral structures with the terminal members of inner electrodes 109. To form the interconnections for inner electrodes 109 on the front side of die 101, interconnect vias 113 may extend through active layer 112. In the illustrated embodiment, interconnect vias extend at least distance d through a front side layer of die 101 to the active layer, terminating at bond pads 114.

In the operation illustrated in FIG. 8K, recess 806 may be optionally formed in the region between outer electrodes 107. In some embodiments, recess 806 is formed by a DRIE process. In alternative embodiments, recess 806 may be formed by mechanical milling or drilling. The extent of recess 806 in the z-direction may depend on the depth of the bridging portion of interconnect vias 113, and may also depend on heat transfer engineering considerations.

In the operation illustrated in FIG. 8L, recess 806 is backfilled with fill material that may be the same as the fill material previously deposited. In some embodiments, a subsequent mechanical or chemical-mechanical polishing operation may be performed to planarize the fill material with die backside 102. After the backfill and planarization operations are performed, TEC 100 is complete.

Figure 9:
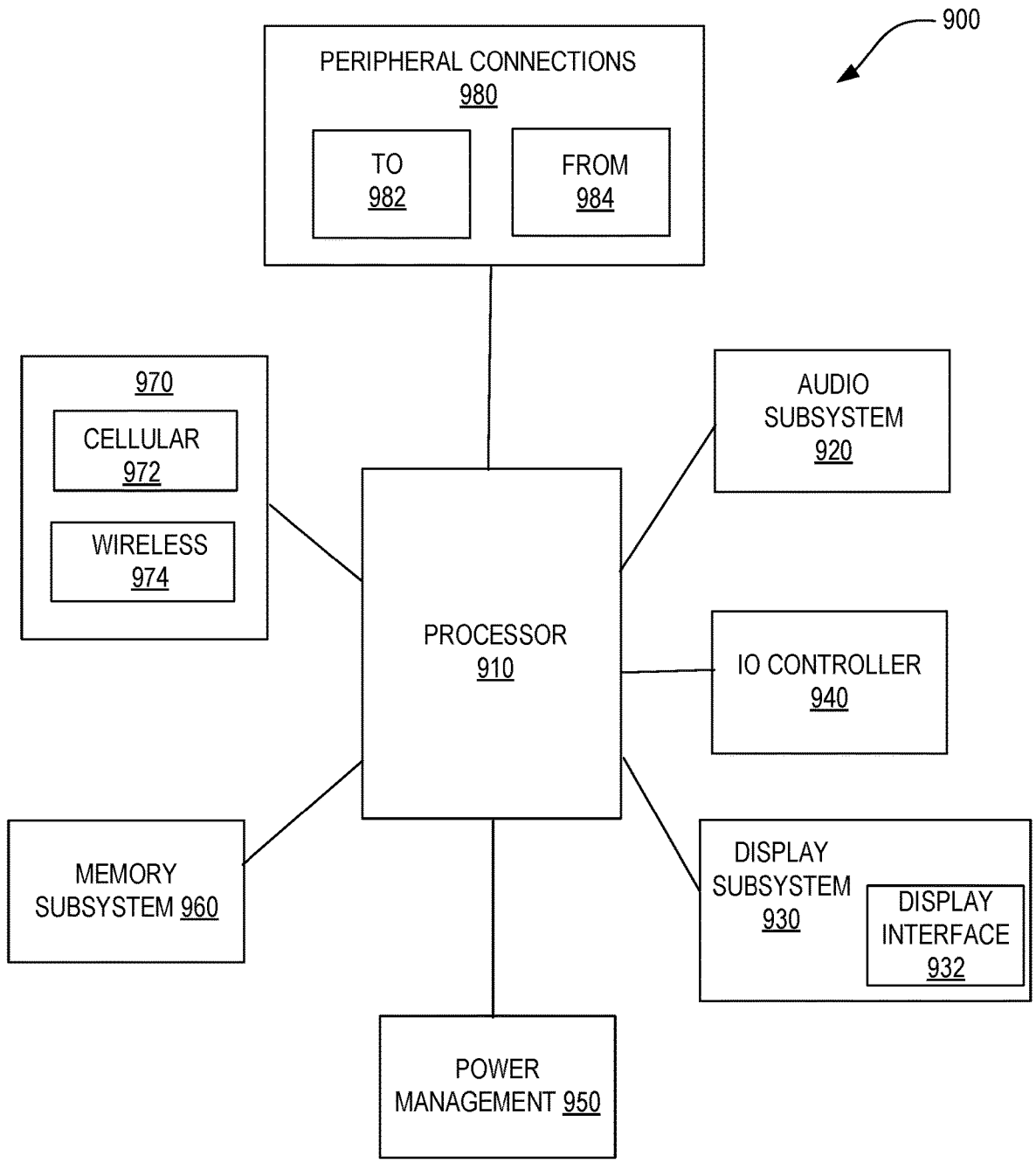
FIG. 9 illustrates a package having one or more dies comprising at least one annular thermoelectric cooler embedded in the one or more dies and fabricated according to the disclosed method, as part of a system-on-chip (SoC) package in an implementation of computing device, according to some embodiments of the disclosure.

FIG. 9 illustrates a block diagram of an embodiment of computing device 900, in which embedded TEC 100 (or any of the described embodiments 200, 300, 400 or 500) could be used. As an example, TEC 100 may be employed in a microprocessor comprising one or more dies and/or fabricated according to the disclosed method, as part of a system on chip (SoC) package in an implementation of computing device 900, according to some embodiments of the disclosure. In some embodiments, computing device 900 represents a mobile computing device, such as a computing tablet, a mobile phone or smart-phone, a wireless-enabled e-reader, or other wireless mobile device. It will be understood that certain components are shown generally, and not all components of such a device are shown in computing device 900.

The various embodiments of the present disclosure may also comprise a network interface within 970 such as a wireless interface so that a system embodiment may be incorporated into a wireless device, for example, cell phone or personal digital assistant.

In one embodiment, processor 910 can include one or more physical devices, such as microprocessors, application processors, microcontrollers, programmable logic devices, or other processing means. The processing operations performed by processor 910 include the execution of an operating platform or operating system on which applications and/or device functions are executed. The processing operations include operations related to I/O (input/output) with a human user or with other devices, operations related to power management, and/or operations related to connecting the computing device 900 to another device. The processing operations may also include operations related to audio I/O and/or display I/O.

In one embodiment, computing device 900 includes audio subsystem 920, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 900, or connected to the computing device 900. In one embodiment, a user interacts with the computing device 900 by providing audio commands that are received and processed by processor 910.

Display subsystem 930 represents hardware (e.g., display devices) and software (e.g., drivers) components that provide a visual and/or tactile display for a user to interact with the computing device 900. Display subsystem 930 includes display interface 932 which includes the particular screen or hardware device used to provide a display to a user. In one embodiment, display interface 932 includes logic separate from processor 910 to perform at least some processing related to the display. In one embodiment, display subsystem 930 includes a touch screen (or touch pad) device that provides both output and input to a user.

I/O controller 940 represents hardware devices and software components related to interaction with a user. I/O controller 940 is operable to manage hardware that is part of audio subsystem 920 and/or display subsystem 930. Additionally, I/O controller 940 illustrates a connection point for additional devices that connect to computing device 900 through which a user might interact with the system. For example, devices that can be attached to the computing device 900 might include microphone devices, speaker or stereo systems, video systems or other display devices, keyboard or keypad devices, or other I/O devices for use with specific applications such as card readers or other devices.

As mentioned above, I/O controller 940 can interact with audio subsystem 920 and/or display subsystem 930. For example, input through a microphone or other audio device can provide input or commands for one or more applications or functions of the computing device 900. Additionally, audio output can be provided instead of, or in addition to display output. In another example, if display subsystem 930 includes a touch screen, the display device also acts as an input device, which can be at least partially managed by I/O controller 940. There can also be additional buttons or switches on the computing device 900 to provide I/O functions managed by I/O controller 940.

In one embodiment, I/O controller 940 manages devices such as accelerometers, cameras, light sensors or other environmental sensors, or other hardware that can be included in the computing device 900. The input can be part of direct user interaction, as well as providing environmental input to the system to influence its operations (such as filtering for noise, adjusting displays for brightness detection, applying a flash for a camera, or other features).

In one embodiment, computing device 900 includes power management 950 that manages battery power usage, charging of the battery, and features related to power saving operation. Memory subsystem 960 includes memory devices for storing information in computing device 900. Memory can include nonvolatile (state does not change if power to the memory device is interrupted) and/or volatile (state is indeterminate if power to the memory device is interrupted) memory devices. Memory subsystem 960 can store application data, user data, music, photos, documents, or other data, as well as system data (whether long-term or temporary) related to the execution of the applications and functions of the computing device 900.

Elements of embodiments are also provided as a machine-readable medium (e.g., memory 960) for storing the computer-executable instructions. The machine-readable medium (e.g., memory 960) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 970 includes hardware devices (e.g., wireless and/or wired connectors and communication hardware) and software components (e.g., drivers, protocol stacks) to enable the computing device 900 to communicate with external devices. The computing device 900 could be separate devices, such as other computing devices, wireless access points or base stations, as well as peripherals such as headsets, printers, or other devices.

Network interface 970 can include multiple different types of connectivity. To generalize, the computing device 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 974 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 980 include hardware interfaces and connectors, as well as software components (e.g., drivers, protocol stacks) to make peripheral connections. It will be understood that the computing device 900 could both be a peripheral device ("to" 982) to other computing devices, as well as have peripheral devices ("from" 984) connected to it. The computing device 900 commonly has a "docking" connector to connect to other computing devices for purposes such as managing (e.g., downloading and/or uploading, changing, synchronizing) content on computing device 900. Additionally, a docking connector can allow computing device 900 to connect to certain peripherals that allow the computing device 900 to control content output, for example, to audiovisual or other systems.

In addition to a proprietary docking connector or other proprietary connection hardware, the computing device 900 can make peripheral connections 980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A microelectronics package, comprising:
   an integrated circuit (IC) die comprising a monocrystalline semiconductor material having a first thermal conductivity, and comprising an active layer subject to developing a hot spot during operation of the IC die; and
   a thermoelectric cooler (TEC) embedded within the monocrystalline semiconductor material, wherein the TEC has an annular shape that is substantially parallel to the active layer, the TEC comprising a thermoelectric material that is confined between an outer sidewall along an outer perimeter of the TEC and an inner sidewall along an inner perimeter of the TEC, wherein the inner sidewall that surrounds an interior region, the interior region is located within the inner perimeter of the TEC and directly below the hot spot and comprises the monocrystalline semiconductor material, and wherein the thermoelectric material has a thermal conductivity less than the first thermal conductivity.

2. The microelectronics package of claim 1, wherein the TEC comprises a plurality of first regions and a plurality of second regions distributed along an annular strip bounded by the outer sidewall and the inner sidewall, wherein the first regions alternate with the second regions along the strip, and wherein the first regions comprise a first thermoelectric material and the second regions comprise a second thermoelectric material, and wherein the first thermoelectric material has a first conductivity type and the second thermoelectric material has a second conductivity type complementary to the first conductivity type.

3. The microelectronics package of claim 1, wherein the monocrystalline semiconductor material is silicon and the thermoelectric material is substantially free of silicon.

4. The microelectronics package of claim 3, wherein a first electrode is between the outer sidewall and the semiconductor material, and a second electrode is between the inner sidewall and interior region, and wherein the first electrode and the second electrode comprise interconnect vias that extend through the active layer.

5. The microelectronics package of claim 1, wherein the thermoelectric material comprises at least one of bismuth, lead, selenium, sulfur, oxygen, tellurium, germanium, tin, magnesium, barium, sodium, gallium, indium, zinc, copper, niobium, cobalt, gold, nickel or titanium.

6. The microelectronics package of claim 1, wherein the TEC is a continuous closed annulus between the outer sidewall and the inner sidewall, and wherein the inner sidewall completely surrounds the interior region.

7. The microelectronics package of claim 1, wherein the TEC has two or more annular segments separated by one or more gaps between the segments, wherein the semiconductor material extends within the one or more gaps.

8. The microelectronics package of claim 1, wherein the TEC has a shape that is any one of a circular annulus, a rectangular annulus or a polygonal annulus.

9. The microelectronics package of claim 1, wherein the thermoelectric material has a microstructure that is any one of a polycrystalline microstructure, a monocrystalline microstructure or an amorphous microstructure.

10. The microelectronics package of claim 1, wherein the inner sidewall and the outer sidewall are separated by a distance of not less than 100 microns.

11. The microelectronics package of claim 1, wherein a distance between the TEC and the active layer is not more than 50 microns.

12. A system, comprising:
a memory; and
an integrated circuit (IC) coupled to the memory, wherein the integrated circuit comprises:
an IC die comprising a monocrystalline semiconductor material having a first thermal conductivity, the IC die comprising an active layer subject to developing a hot spot during operation of the IC die; and
a thermoelectric cooler (TEC) embedded within the monocrystalline semiconductor material, wherein the TEC has an annular shape that is substantially parallel to the active layer, the TEC comprising a thermoelectric material that is confined between an outer sidewall along an outer perimeter of the TEC and an inner sidewall along an inner perimeter of the TEC wherein the inner sidewall surrounds an interior region, the interior region is located within the inner perimeter of the TEC and directly below the hot spot and comprises the monocrystalline semiconductor material, and wherein the thermoelectric material has a thermal conductivity less than the first thermal conductivity,
wherein the integrated circuit is coupled to a first power supply, and wherein the TEC is coupled to a second power supply.

13. The system of claim 12, wherein a first electrode is coupled the inner sidewall and a second electrode is coupled to the outer sidewall, wherein the first electrode and the second electrode are coupled to the second power supply, and wherein the outer sidewall is to be a hot side of the TEC, and the inner sidewall is to be a cold side of the TEC.

14. The system of claim 12, wherein a temperature sensor is within or under the active layer, and wherein the temperature sensor is coupled to a temperature control unit that is coupled to the second power supply.

15. The system of claim 12, wherein the integrated circuit is a microprocessor or a memory.

* * * * *